US008566516B2

(12) United States Patent
Schakel et al.

(10) Patent No.: US 8,566,516 B2
(45) Date of Patent: Oct. 22, 2013

(54) REFRESH MANAGEMENT OF MEMORY MODULES

(75) Inventors: Keith R. Schakel, San Jose, CA (US); Suresh Natarajan Rajan, San Jose, CA (US); Michael John Sebastian Smith, Palo Alto, CA (US); David T. Wang, San Jose, CA (US)

(73) Assignee: Google Inc., Mountain View, CA (US)

( * ) Notice: Subject to any disclaimer, the term of this patent is extended or adjusted under 35 U.S.C. 154(b) by 655 days.

(21) Appl. No.: 11/929,631

(22) Filed: Oct. 30, 2007

(65) Prior Publication Data

US 2008/0109597 A1    May 8, 2008

Related U.S. Application Data

(63) Continuation of application No. 11/828,181, filed on Jul. 25, 2007, which is a continuation-in-part of application No. 11/584,179, filed on Oct. 20, 2006, now Pat. No. 7,581,127, which is a continuation of application No. 11/524,811, filed on Sep. 20, 2006, now Pat. No. 7,590,796, which is a continuation-in-part of application No. 11/461,439, filed on Jul. 31, 2006, now Pat. No. 7,580,312.

(60) Provisional application No. 60/823,229, filed on Aug. 22, 2006.

(51) Int. Cl.
*G06F 13/12* (2006.01)

(52) U.S. Cl.
USPC .................... 711/106; 711/173; 711/E12.001

(58) Field of Classification Search
USPC ................................................ 711/106, 173
See application file for complete search history.

(56) References Cited

U.S. PATENT DOCUMENTS

| 3,800,292 A | 3/1974 | Curley et al. |
| 4,069,452 A | 1/1978 | Conway et al. |
| 4,323,965 A | 4/1982 | Johnson et al. |
| 4,334,307 A | 6/1982 | Bourgeois et al. |
| 4,345,319 A | 8/1982 | Bernardini et al. |
| 4,392,212 A | 7/1983 | Miyasaka et al. ............. 365/230 |
| 4,525,921 A | 7/1985 | Carson et al. |
| 4,566,082 A | 1/1986 | Anderson |

(Continued)

FOREIGN PATENT DOCUMENTS

| DE | 102004051345 | 5/2006 |
| DE | 102004053316 | 5/2006 |

(Continued)

OTHER PUBLICATIONS

Non-final Office Action from U.S. Appl. No. 11/461,430 mailed on Feb. 19, 2009.

(Continued)

*Primary Examiner* — Kenneth Lo
(74) *Attorney, Agent, or Firm* — Fish & Richardson P.C.

(57) ABSTRACT

One embodiment sets forth an interface circuit configured to manage refresh command sequences that includes a system interface adapted to receive a refresh command from a memory controller, clock frequency detection circuitry configured to determine the timing for issuing staggered refresh commands to two or more memory devices coupled to the interface circuit based on the refresh command received from the memory controller, and at least two refresh command sequence outputs configured to generate the staggered refresh commands for the two or more memory devices.

24 Claims, 18 Drawing Sheets

(56) References Cited

U.S. PATENT DOCUMENTS

| | | | | |
|---|---|---|---|---|
| 4,592,019 | A | 5/1986 | Huang et al. | |
| 4,646,128 | A | 2/1987 | Carson et al. | |
| 4,698,748 | A | 10/1987 | Juzswik et al. | |
| 4,706,166 | A | 11/1987 | Go | |
| 4,710,903 | A | 12/1987 | Hereth et al. | |
| 4,764,846 | A | 8/1988 | Go | |
| 4,780,843 | A | 10/1988 | Tietjen | |
| 4,794,597 | A | 12/1988 | Ooba et al. | |
| 4,796,232 | A | 1/1989 | House | 365/189 |
| 4,807,191 | A | 2/1989 | Flannagan | |
| 4,841,440 | A | 6/1989 | Yonezu et al. | |
| 4,862,347 | A | 8/1989 | Rudy | |
| 4,884,237 | A | 11/1989 | Mueller et al. | |
| 4,887,240 | A | 12/1989 | Garverick et al. | 361/222 |
| 4,888,687 | A | 12/1989 | Allison et al. | |
| 4,899,107 | A | 2/1990 | Corbett et al. | |
| 4,912,678 | A * | 3/1990 | Mashiko | 365/222 |
| 4,922,451 | A | 5/1990 | Lo et al. | |
| 4,935,734 | A | 6/1990 | Austin | |
| 4,937,791 | A | 6/1990 | Steele et al. | |
| 4,956,694 | A | 9/1990 | Eide | |
| 4,982,265 | A | 1/1991 | Watanabe et al. | |
| 4,983,533 | A | 1/1991 | Go | |
| 5,025,364 | A | 6/1991 | Zellmer | |
| 5,072,424 | A | 12/1991 | Brent et al. | 365/189 |
| 5,083,266 | A | 1/1992 | Watanabe | |
| 5,104,820 | A | 4/1992 | Go et al. | |
| 5,193,072 | A | 3/1993 | Frenkil et al. | |
| 5,212,666 | A | 5/1993 | Takeda | |
| 5,220,672 | A | 6/1993 | Nakao et al. | |
| 5,222,014 | A | 6/1993 | Lin | |
| 5,241,266 | A | 8/1993 | Ahmad et al. | |
| 5,252,807 | A | 10/1993 | Chizinsky | |
| 5,257,233 | A | 10/1993 | Schaefer | |
| 5,278,796 | A | 1/1994 | Tillinghast et al. | |
| 5,282,177 | A | 1/1994 | McLaury | |
| 5,332,922 | A | 7/1994 | Oguchi et al. | 257/723 |
| 5,347,428 | A | 9/1994 | Carson et al. | |
| 5,369,749 | A | 11/1994 | Baker et al. | |
| 5,384,745 | A | 1/1995 | Konishi et al. | |
| 5,388,265 | A | 2/1995 | Volk | |
| 5,390,334 | A | 2/1995 | Harrison | |
| 5,392,251 | A | 2/1995 | Manning | |
| 5,408,190 | A | 4/1995 | Wood et al. | |
| 5,432,729 | A | 7/1995 | Carson et al. | |
| 5,448,511 | A | 9/1995 | Paurus et al. | |
| 5,467,455 | A | 11/1995 | Gay et al. | |
| 5,483,497 | A | 1/1996 | Mochizuki et al. | |
| 5,498,886 | A | 3/1996 | Hsu et al. | 257/213 |
| 5,502,333 | A | 3/1996 | Bertin et al. | |
| 5,502,667 | A | 3/1996 | Bertin et al. | |
| 5,513,135 | A | 4/1996 | Dell et al. | |
| 5,513,339 | A | 4/1996 | Agrawal et al. | |
| 5,519,832 | A | 5/1996 | Warchol | |
| 5,526,320 | A | 6/1996 | Zagar et al. | |
| 5,530,836 | A | 6/1996 | Busch et al. | |
| 5,550,781 | A | 8/1996 | Sugawara et al. | |
| 5,559,990 | A | 9/1996 | Cheng et al. | |
| 5,561,622 | A | 10/1996 | Bertin et al. | |
| 5,563,086 | A | 10/1996 | Bertin et al. | |
| 5,566,344 | A | 10/1996 | Hall et al. | |
| 5,581,498 | A | 12/1996 | Ludwig et al. | |
| 5,581,779 | A | 12/1996 | Hall et al. | |
| 5,590,071 | A | 12/1996 | Kolor et al. | |
| 5,598,376 | A | 1/1997 | Merritt et al. | |
| 5,604,714 | A | 2/1997 | Manning et al. | |
| 5,606,710 | A | 2/1997 | Hall et al. | |
| 5,608,262 | A | 3/1997 | Degani et al. | |
| 5,610,864 | A | 3/1997 | Manning | |
| 5,623,686 | A | 4/1997 | Hall et al. | |
| 5,627,791 | A | 5/1997 | Wright et al. | |
| 5,640,337 | A | 6/1997 | Huang et al. | |
| 5,640,364 | A | 6/1997 | Merritt et al. | |
| 5,652,724 | A | 7/1997 | Manning | |
| 5,654,204 | A | 8/1997 | Anderson | |
| 5,661,677 | A | 8/1997 | Rondeau et al. | |
| 5,661,695 | A | 8/1997 | Zagar et al. | |
| 5,668,773 | A | 9/1997 | Zagar et al. | |
| 5,675,549 | A | 10/1997 | Ong et al. | |
| 5,680,342 | A | 10/1997 | Frankeny | |
| 5,682,354 | A | 10/1997 | Manning | |
| 5,692,121 | A | 11/1997 | Bozso et al. | |
| 5,692,202 | A | 11/1997 | Kardach et al. | |
| 5,696,732 | A | 12/1997 | Zagar et al. | |
| 5,696,929 | A | 12/1997 | Hasbun et al. | |
| 5,702,984 | A | 12/1997 | Bertin et al. | |
| 5,703,813 | A | 12/1997 | Manning et al. | |
| 5,706,247 | A | 1/1998 | Merritt et al. | |
| RE35,733 | E | 2/1998 | Hernandez et al. | |
| 5,717,654 | A | 2/1998 | Manning | |
| 5,721,859 | A | 2/1998 | Manning | |
| 5,724,288 | A | 3/1998 | Cloud et al. | |
| 5,729,503 | A | 3/1998 | Manning | |
| 5,729,504 | A | 3/1998 | Cowles | 365/236 |
| 5,742,792 | A | 4/1998 | Yanai et al. | |
| 5,748,914 | A | 5/1998 | Barth et al. | |
| 5,752,045 | A | 5/1998 | Chen | |
| 5,757,703 | A | 5/1998 | Merritt et al. | |
| 5,760,478 | A | 6/1998 | Bozso et al. | |
| 5,761,703 | A | 6/1998 | Bolyn | 711/106 |
| 5,781,766 | A | 7/1998 | Davis | |
| 5,787,457 | A | 7/1998 | Miller et al. | |
| 5,798,961 | A | 8/1998 | Heyden et al. | |
| 5,802,010 | A | 9/1998 | Zagar et al. | |
| 5,802,395 | A | 9/1998 | Connolly et al. | |
| 5,802,555 | A | 9/1998 | Shigeeda | 711/106 |
| 5,812,488 | A | 9/1998 | Zagar et al. | |
| 5,819,065 | A | 10/1998 | Chilton et al. | |
| 5,831,833 | A | 11/1998 | Shirakawa et al. | |
| 5,831,931 | A | 11/1998 | Manning | |
| 5,831,932 | A | 11/1998 | Merritt et al. | |
| 5,834,838 | A | 11/1998 | Anderson | |
| 5,835,435 | A | 11/1998 | Bogin et al. | |
| 5,838,165 | A | 11/1998 | Chatter | |
| 5,838,177 | A | 11/1998 | Keeth | |
| 5,841,580 | A | 11/1998 | Farmwald et al. | 365/194 |
| 5,843,799 | A | 12/1998 | Hsu et al. | 438/6 |
| 5,843,807 | A | 12/1998 | Burns | |
| 5,845,108 | A | 12/1998 | Yoo et al. | |
| 5,850,368 | A | 12/1998 | Ong et al. | |
| 5,859,792 | A | 1/1999 | Rondeau et al. | |
| 5,860,106 | A | 1/1999 | Domen et al. | |
| 5,870,347 | A | 2/1999 | Keeth et al. | |
| 5,870,350 | A | 2/1999 | Bertin et al. | |
| 5,872,907 | A | 2/1999 | Griess et al. | |
| 5,875,142 | A | 2/1999 | Chevallier | |
| 5,878,279 | A | 3/1999 | Athenes | |
| 5,884,088 | A | 3/1999 | Kardach et al. | |
| 5,901,105 | A | 5/1999 | Ong et al. | |
| 5,903,500 | A | 5/1999 | Tsang et al. | |
| 5,905,688 | A | 5/1999 | Park | |
| 5,907,512 | A | 5/1999 | Parkinson et al. | |
| 5,910,010 | A | 6/1999 | Nishizawa et al. | |
| 5,915,105 | A | 6/1999 | Farmwald et al. | |
| 5,915,167 | A | 6/1999 | Leedy | |
| 5,917,758 | A | 6/1999 | Keeth | |
| 5,923,611 | A | 7/1999 | Ryan | |
| 5,924,111 | A | 7/1999 | Huang et al. | |
| 5,926,435 | A | 7/1999 | Park et al. | |
| 5,929,650 | A | 7/1999 | Pappert et al. | |
| 5,943,254 | A | 8/1999 | Bakeman, Jr. et al. | |
| 5,946,265 | A | 8/1999 | Cowles | |
| 5,949,254 | A | 9/1999 | Keeth | |
| 5,953,215 | A | 9/1999 | Karabatsos | |
| 5,953,263 | A | 9/1999 | Farmwald et al. | |
| 5,954,804 | A | 9/1999 | Farmwald et al. | |
| 5,956,233 | A | 9/1999 | Yew et al. | |
| 5,963,429 | A | 10/1999 | Chen | |
| 5,963,463 | A | 10/1999 | Rondeau et al. | |
| 5,963,464 | A | 10/1999 | Dell et al. | |
| 5,963,504 | A | 10/1999 | Manning | |
| 5,966,724 | A | 10/1999 | Ryan | |
| 5,966,727 | A | 10/1999 | Nishino | |
| 5,969,996 | A | 10/1999 | Muranaka et al. | 365/189.01 |

(56) References Cited

U.S. PATENT DOCUMENTS

| | | | |
|---|---|---|---|
| 5,973,392 A | 10/1999 | Senba et al. | |
| 5,978,304 A | 11/1999 | Crafts | |
| 5,995,424 A | 11/1999 | Lawrence et al. | |
| 5,995,443 A | 11/1999 | Farmwald et al. | |
| 6,001,671 A | 12/1999 | Fjelstad | |
| 6,002,613 A | 12/1999 | Cloud et al. | |
| 6,002,627 A | 12/1999 | Chevallier | |
| 6,014,339 A | 1/2000 | Kobayashi et al. | |
| 6,016,282 A | 1/2000 | Keeth | |
| 6,026,027 A | 2/2000 | Terrell, II et al. | |
| 6,026,050 A | 2/2000 | Baker et al. | 365/233 |
| 6,029,250 A | 2/2000 | Keeth | 713/400 |
| 6,032,214 A | 2/2000 | Farmwald et al. | |
| 6,032,215 A | 2/2000 | Farmwald et al. | |
| 6,034,916 A | 3/2000 | Lee | |
| 6,034,918 A | 3/2000 | Farmwald et al. | |
| 6,035,365 A | 3/2000 | Farmwald et al. | |
| 6,038,195 A | 3/2000 | Farmwald et al. | |
| 6,038,673 A | 3/2000 | Benn et al. | |
| 6,044,032 A | 3/2000 | Li | |
| 6,047,073 A | 4/2000 | Norris et al. | |
| 6,047,344 A | 4/2000 | Kawasumi et al. | |
| 6,047,361 A | 4/2000 | Ingenio et al. | |
| 6,053,948 A | 4/2000 | Vaidyanathan et al. | 703/14 |
| 6,058,451 A | 5/2000 | Bermingham et al. | |
| 6,065,092 A | 5/2000 | Roy | |
| 6,069,504 A | 5/2000 | Keeth | |
| 6,070,217 A | 5/2000 | Connolly et al. | |
| 6,073,223 A | 6/2000 | McAllister et al. | |
| 6,075,730 A | 6/2000 | Barth et al. | |
| 6,075,744 A | 6/2000 | Tsern et al. | 365/230 |
| 6,078,546 A | 6/2000 | Lee | |
| 6,079,025 A | 6/2000 | Fung | |
| 6,084,434 A | 7/2000 | Keeth | |
| 6,088,290 A | 7/2000 | Ohtake et al. | |
| 6,091,251 A | 7/2000 | Wood et al. | |
| RE36,839 E | 8/2000 | Simmons et al. | |
| 6,101,152 A | 8/2000 | Farmwald et al. | |
| 6,101,564 A | 8/2000 | Athenes et al. | |
| 6,101,612 A | 8/2000 | Jeddeloh | |
| 6,108,795 A | 8/2000 | Jeddeloh | |
| 6,111,812 A | 8/2000 | Gans et al. | 365/233 |
| 6,134,638 A | 10/2000 | Olarig et al. | 711/167 |
| 6,154,370 A | 11/2000 | Degani et al. | |
| 6,166,991 A | 12/2000 | Phelan | |
| 6,181,640 B1 | 1/2001 | Kang | |
| 6,182,184 B1 | 1/2001 | Farmwald et al. | |
| 6,199,151 B1 | 3/2001 | Williams et al. | |
| 6,208,168 B1 | 3/2001 | Rhee | |
| 6,216,246 B1 | 4/2001 | Shau | 714/763 |
| 6,222,739 B1 | 4/2001 | Bhakta et al. | |
| 6,226,709 B1 | 5/2001 | Goodwin et al. | |
| 6,226,730 B1 | 5/2001 | Murdoch et al. | |
| 6,233,192 B1 | 5/2001 | Tanaka | |
| 6,233,650 B1 | 5/2001 | Johnson et al. | |
| 6,240,048 B1 | 5/2001 | Matsubara | |
| 6,243,282 B1 | 6/2001 | Rondeau et al. | |
| 6,252,807 B1 | 6/2001 | Suzuki et al. | |
| 6,253,278 B1 | 6/2001 | Ryan | |
| 6,260,097 B1 | 7/2001 | Farmwald et al. | |
| 6,260,154 B1 | 7/2001 | Jeddeloh | |
| 6,262,938 B1 | 7/2001 | Lee et al. | |
| 6,266,285 B1 | 7/2001 | Farmwald et al. | |
| 6,266,292 B1 | 7/2001 | Tsern et al. | 365/230 |
| 6,274,395 B1 | 8/2001 | Weber | |
| 6,279,069 B1 | 8/2001 | Robinson et al. | 711/103 |
| 6,295,572 B1 | 9/2001 | Wu | |
| 6,298,426 B1 | 10/2001 | Ajanovic | |
| 6,304,511 B1 | 10/2001 | Gans et al. | 365/233 |
| 6,307,769 B1 | 10/2001 | Nuxoll et al. | |
| 6,314,051 B1 | 11/2001 | Farmwald et al. | |
| 6,317,352 B1 | 11/2001 | Halbert et al. | 365/52 |
| 6,317,381 B1 | 11/2001 | Gans et al. | 365/233 |
| 6,324,120 B2 | 11/2001 | Farmwald et al. | |
| 6,326,810 B1 | 12/2001 | Keeth | |
| 6,327,664 B1 | 12/2001 | Dell et al. | |
| 6,330,683 B1 | 12/2001 | Jeddeloh | |
| 6,336,174 B1 | 1/2002 | Li et al. | |
| 6,338,108 B1 | 1/2002 | Motomura | |
| 6,338,113 B1 | 1/2002 | Kubo et al. | |
| 6,341,347 B1 | 1/2002 | Joy et al. | 712/228 |
| 6,343,019 B1 | 1/2002 | Jiang et al. | |
| 6,343,042 B1 | 1/2002 | Tsern et al. | 365/222 |
| 6,353,561 B1 | 3/2002 | Funyu et al. | |
| 6,356,105 B1 | 3/2002 | Volk | |
| 6,356,500 B1 | 3/2002 | Cloud et al. | |
| 6,362,656 B2 | 3/2002 | Rhee | |
| 6,363,031 B2 | 3/2002 | Phelan | |
| 6,378,020 B2 | 4/2002 | Farmwald et al. | |
| 6,381,188 B1 | 4/2002 | Choi et al. | |
| 6,381,668 B1 | 4/2002 | Lunteren | |
| 6,389,514 B1 | 5/2002 | Rokicki | |
| 6,392,304 B1 | 5/2002 | Butler | |
| 6,414,868 B1 | 7/2002 | Wong et al. | 365/51 |
| 6,418,034 B1 | 7/2002 | Weber et al. | |
| 6,421,754 B1 * | 7/2002 | Kau et al. | 710/261 |
| 6,424,532 B2 | 7/2002 | Kawamura | |
| 6,426,916 B2 | 7/2002 | Farmwald et al. | |
| 6,429,029 B1 | 8/2002 | Eldridge et al. | |
| 6,430,103 B2 | 8/2002 | Nakayama et al. | |
| 6,434,660 B1 | 8/2002 | Lambert et al. | |
| 6,437,600 B1 | 8/2002 | Keeth | |
| 6,438,057 B1 * | 8/2002 | Ruckerbauer | 365/222 |
| 6,442,698 B2 | 8/2002 | Nizar | |
| 6,445,591 B1 | 9/2002 | Kwong | |
| 6,452,826 B1 | 9/2002 | Kim et al. | |
| 6,452,863 B2 | 9/2002 | Farmwald et al. | |
| 6,453,400 B1 | 9/2002 | Maesako et al. | |
| 6,453,402 B1 | 9/2002 | Jeddeloh | 711/167 |
| 6,453,434 B2 | 9/2002 | Delp et al. | |
| 6,455,348 B1 | 9/2002 | Yamaguchi | |
| 6,457,095 B1 | 9/2002 | Volk | |
| 6,459,651 B1 | 10/2002 | Lee et al. | |
| 6,473,831 B1 | 10/2002 | Schade | |
| 6,476,476 B1 | 11/2002 | Glenn | |
| 6,480,929 B1 | 11/2002 | Gauthier et al. | |
| 6,487,102 B1 | 11/2002 | Halbert et al. | |
| 6,489,669 B2 | 12/2002 | Shimada et al. | |
| 6,490,161 B1 | 12/2002 | Johnson | |
| 6,492,726 B1 | 12/2002 | Quek et al. | |
| 6,493,789 B2 | 12/2002 | Ware et al. | |
| 6,496,440 B2 | 12/2002 | Manning | |
| 6,496,897 B2 | 12/2002 | Ware et al. | |
| 6,498,766 B2 | 12/2002 | Lee et al. | 365/233 |
| 6,510,097 B2 | 1/2003 | Fukuyama | |
| 6,510,503 B2 | 1/2003 | Gillingham et al. | |
| 6,512,392 B2 | 1/2003 | Fleury et al. | |
| 6,521,984 B2 | 2/2003 | Matsuura | |
| 6,526,471 B1 | 2/2003 | Shimomura et al. | |
| 6,526,473 B1 | 2/2003 | Kim | |
| 6,526,484 B1 | 2/2003 | Stacovsky et al. | |
| 6,545,895 B1 | 4/2003 | Li et al. | |
| 6,546,446 B2 | 4/2003 | Farmwald et al. | |
| 6,553,450 B1 | 4/2003 | Dodd et al. | |
| 6,560,158 B2 | 5/2003 | Choi et al. | |
| 6,563,337 B2 | 5/2003 | Dour | |
| 6,563,759 B2 | 5/2003 | Yahata et al. | |
| 6,564,281 B2 | 5/2003 | Farmwald et al. | |
| 6,564,285 B1 | 5/2003 | Mills et al. | 711/103 |
| 6,574,150 B2 | 6/2003 | Suyama et al. | |
| 6,584,037 B2 | 6/2003 | Farmwald et al. | |
| 6,587,912 B2 | 7/2003 | Leddige et al. | |
| 6,590,822 B2 | 7/2003 | Hwang et al. | |
| 6,594,770 B1 | 7/2003 | Sato et al. | |
| 6,597,616 B2 | 7/2003 | Tsern et al. | 365/222 |
| 6,597,617 B2 | 7/2003 | Ooishi et al. | |
| 6,614,700 B2 | 9/2003 | Dietrich et al. | |
| 6,618,267 B1 | 9/2003 | Dalal et al. | |
| 6,618,791 B1 | 9/2003 | Dodd et al. | |
| 6,621,760 B1 | 9/2003 | Ahmad et al. | |
| 6,628,538 B2 | 9/2003 | Funaba et al. | |
| 6,630,729 B2 | 10/2003 | Huang | |
| 6,631,086 B1 | 10/2003 | Bill et al. | |
| 6,639,820 B1 | 10/2003 | Khandekar et al. | |

(56) References Cited

U.S. PATENT DOCUMENTS

| | | |
|---|---|---|
| 6,646,939 B2 | 11/2003 | Kwak |
| 6,650,588 B2 | 11/2003 | Yamagata ................... 365/222 |
| 6,650,594 B1 | 11/2003 | Lee et al. |
| 6,657,634 B1 | 12/2003 | Sinclair et al. |
| 6,657,918 B2 | 12/2003 | Foss et al. |
| 6,657,919 B2 | 12/2003 | Foss et al. |
| 6,658,016 B1 | 12/2003 | Dai et al. |
| 6,658,530 B1 | 12/2003 | Robertson et al. |
| 6,659,512 B1 | 12/2003 | Harper et al. |
| 6,664,625 B2 | 12/2003 | Hiruma |
| 6,665,224 B1 | 12/2003 | Lehmann et al. |
| 6,665,227 B2 | 12/2003 | Fetzer |
| 6,668,242 B1 | 12/2003 | Reynov et al. |
| 6,674,154 B2 | 1/2004 | Minamio et al. |
| 6,683,372 B1 | 1/2004 | Wong et al. |
| 6,684,292 B2 | 1/2004 | Piccirillo et al. |
| 6,690,191 B2 | 2/2004 | Wu et al. |
| 6,697,295 B2 | 2/2004 | Farmwald et al. |
| 6,701,446 B2 | 3/2004 | Tsern et al. |
| 6,705,877 B1 | 3/2004 | Li et al. |
| 6,708,144 B1 | 3/2004 | Merryman et al. |
| 6,710,430 B2 | 3/2004 | Minamio et al. |
| 6,711,043 B2 | 3/2004 | Friedman et al. |
| 6,713,856 B2 | 3/2004 | Tsai et al. |
| 6,714,891 B2 | 3/2004 | Dendinger |
| 6,724,684 B2 | 4/2004 | Kim |
| 6,730,540 B2 | 5/2004 | Siniaguine |
| 6,731,009 B1 | 5/2004 | Jones et al. |
| 6,731,527 B2 | 5/2004 | Brown ............................ 365/63 |
| 6,742,098 B1 | 5/2004 | Halbert et al. |
| 6,744,687 B2 | 6/2004 | Koo et al. |
| 6,747,887 B2 | 6/2004 | Halbert et al. |
| 6,751,113 B2 | 6/2004 | Bhakta et al. |
| 6,751,696 B2 | 6/2004 | Farmwald et al. |
| 6,754,129 B2 | 6/2004 | Khatri et al. |
| 6,754,132 B2 | 6/2004 | Kyung |
| 6,757,751 B1 | 6/2004 | Gene |
| 6,762,948 B2 | 7/2004 | Kyun et al. |
| 6,765,812 B2 | 7/2004 | Anderson |
| 6,766,469 B2 | 7/2004 | Larson et al. |
| 6,771,526 B2 | 8/2004 | LaBerge |
| 6,772,359 B2 | 8/2004 | Kwak et al. |
| 6,779,097 B2 | 8/2004 | Gillingham et al. |
| 6,785,767 B2 | 8/2004 | Coulson |
| 6,791,877 B2 | 9/2004 | Miura et al. |
| 6,795,899 B2 | 9/2004 | Dodd et al. |
| 6,799,241 B2 | 9/2004 | Kahn et al. |
| 6,801,989 B2 | 10/2004 | Johnson et al. ............... 711/167 |
| 6,807,598 B2 | 10/2004 | Farmwald et al. |
| 6,807,650 B2 | 10/2004 | Lamb et al. |
| 6,807,655 B1 | 10/2004 | Rehani et al. |
| 6,816,991 B2 | 11/2004 | Sanghani |
| 6,819,602 B2 | 11/2004 | Seo et al. |
| 6,819,617 B2 | 11/2004 | Hwang et al. |
| 6,820,163 B1 | 11/2004 | McCall et al. |
| 6,820,169 B2 | 11/2004 | Wilcox et al. |
| 6,826,104 B2 | 11/2004 | Kawaguchi et al. |
| 6,839,290 B2 | 1/2005 | Ahmad et al. |
| 6,845,027 B2 | 1/2005 | Mayer et al. |
| 6,845,055 B1 | 1/2005 | Koga et al. |
| 6,847,582 B2 | 1/2005 | Pan |
| 6,850,449 B2 | 2/2005 | Takahashi |
| 6,854,043 B2 | 2/2005 | Hargis et al. |
| 6,862,202 B2 | 3/2005 | Schaefer |
| 6,862,249 B2 | 3/2005 | Kyung |
| 6,862,653 B1 | 3/2005 | Dodd et al. |
| 6,873,534 B2 | 3/2005 | Bhakta et al. |
| 6,878,570 B2 | 4/2005 | Lyu et al. |
| 6,894,933 B2 | 5/2005 | Kuzmenka et al. |
| 6,898,683 B2 | 5/2005 | Nakamura |
| 6,908,314 B2 | 6/2005 | Brown |
| 6,912,778 B2 | 7/2005 | Ahn et al. |
| 6,914,786 B1 | 7/2005 | Paulsen et al. |
| 6,917,219 B2 | 7/2005 | New ............................... 326/41 |
| 6,922,371 B2 | 7/2005 | Takahashi et al. |
| 6,930,900 B2 | 8/2005 | Bhakta et al. |
| 6,930,903 B2 | 8/2005 | Bhakta et al. |
| 6,938,119 B2 | 8/2005 | Kohn et al. |
| 6,943,450 B2 | 9/2005 | Fee et al. |
| 6,944,748 B2 | 9/2005 | Sanches et al. |
| 6,947,341 B2 | 9/2005 | Stubbs et al. |
| 6,951,982 B2 | 10/2005 | Chye et al. |
| 6,952,794 B2 | 10/2005 | Lu |
| 6,961,281 B2 | 11/2005 | Wong et al. |
| 6,968,416 B2 | 11/2005 | Moy |
| 6,968,419 B1 | 11/2005 | Holman |
| 6,970,968 B1 | 11/2005 | Holman |
| 6,980,021 B1 | 12/2005 | Srivastava et al. .............. 326/30 |
| 6,986,118 B2 | 1/2006 | Dickman |
| 6,992,501 B2 | 1/2006 | Rapport |
| 6,992,950 B2 | 1/2006 | Foss et al. |
| 7,000,062 B2 | 2/2006 | Perego et al. |
| 7,003,618 B2 | 2/2006 | Perego et al. |
| 7,003,639 B2 | 2/2006 | Tsern et al. |
| 7,007,095 B2 | 2/2006 | Chen et al. |
| 7,007,175 B2 | 2/2006 | Chang et al. |
| 7,010,642 B2 | 3/2006 | Perego et al. |
| 7,010,736 B1 | 3/2006 | Teh et al. |
| 7,024,518 B2 | 4/2006 | Halbert et al. ................. 711/115 |
| 7,026,708 B2 | 4/2006 | Cady et al. |
| 7,028,215 B2 | 4/2006 | Depew et al. |
| 7,028,234 B2 | 4/2006 | Huckaby et al. |
| 7,033,861 B1 | 4/2006 | Partridge et al. |
| 7,035,150 B2 | 4/2006 | Streif et al. |
| 7,043,599 B1 | 5/2006 | Ware et al. ..................... 711/106 |
| 7,043,611 B2 | 5/2006 | McClannahan et al. |
| 7,045,396 B2 | 5/2006 | Crowley et al. |
| 7,045,901 B2 | 5/2006 | Lin et al. |
| 7,046,538 B2 | 5/2006 | Kinsley et al. |
| 7,053,470 B1 | 5/2006 | Sellers et al. |
| 7,053,478 B2 | 5/2006 | Roper et al. |
| 7,058,776 B2 | 6/2006 | Lee ................................ 711/167 |
| 7,058,863 B2 | 6/2006 | Kouchi et al. |
| 7,061,784 B2 | 6/2006 | Jakobs et al. |
| 7,061,823 B2 | 6/2006 | Faue et al. |
| 7,066,741 B2 | 6/2006 | Burns et al. |
| 7,075,175 B2 | 7/2006 | Kazi et al. |
| 7,079,396 B2 | 7/2006 | Gates et al. |
| 7,079,441 B1 | 7/2006 | Partsch et al. |
| 7,079,446 B2 | 7/2006 | Murtagh et al. |
| 7,085,152 B2 | 8/2006 | Ellis et al. ..................... 365/149 |
| 7,085,941 B2 | 8/2006 | Li |
| 7,089,438 B2 | 8/2006 | Raad |
| 7,093,101 B2 | 8/2006 | Aasheim et al. |
| 7,103,730 B2 | 9/2006 | Saxena et al. |
| 7,110,322 B2 | 9/2006 | Farmwald et al. |
| 7,111,143 B2 | 9/2006 | Walker |
| 7,117,309 B2 | 10/2006 | Bearden |
| 7,119,428 B2 | 10/2006 | Tanie et al. |
| 7,120,727 B2 | 10/2006 | Lee et al. ........................... 711/5 |
| 7,126,399 B1 | 10/2006 | Lee |
| 7,127,567 B2 | 10/2006 | Ramakrishnan et al. |
| 7,133,960 B1 | 11/2006 | Thompson et al. ............... 711/5 |
| 7,136,978 B2 | 11/2006 | Miura et al. |
| 7,138,823 B2 | 11/2006 | Janzen et al. |
| 7,149,145 B2 | 12/2006 | Kim et al. ..................... 365/233 |
| 7,149,824 B2 | 12/2006 | Johnson |
| 7,173,863 B2 | 2/2007 | Conley et al. |
| 7,200,021 B2 | 4/2007 | Raghuram ....................... 365/51 |
| 7,205,789 B1 | 4/2007 | Karabatsos |
| 7,210,059 B2 | 4/2007 | Jeddeloh |
| 7,215,561 B2 | 5/2007 | Park et al. |
| 7,218,566 B1 | 5/2007 | Totolos, Jr. et al. |
| 7,224,595 B2 | 5/2007 | Dreps et al. ...................... 365/63 |
| 7,228,264 B2 | 6/2007 | Barrenscheen et al. |
| 7,231,562 B2 | 6/2007 | Ohlhoff et al. |
| 7,233,541 B2 | 6/2007 | Yamamoto et al. ...... 365/230.03 |
| 7,234,081 B2 | 6/2007 | Nguyen et al. |
| 7,243,185 B2 | 7/2007 | See et al. |
| 7,245,541 B2 | 7/2007 | Janzen |
| 7,254,036 B2 | 8/2007 | Pauley et al. .................. 361/721 |
| 7,266,639 B2 | 9/2007 | Raghuram ..................... 711/115 |
| 7,269,042 B2 | 9/2007 | Kinsley et al. ................... 365/52 |
| 7,269,708 B2 | 9/2007 | Ware |

(56) References Cited

U.S. PATENT DOCUMENTS

| | | |
|---|---|---|
| 7,274,583 B2 | 9/2007 | Park et al. |
| 7,277,333 B2 | 10/2007 | Schaefer |
| 7,286,436 B2 | 10/2007 | Bhakta et al. ............... 365/230 |
| 7,289,386 B2 | 10/2007 | Bhakta et al. |
| 7,296,754 B2 | 11/2007 | Nishizawa et al. ........... 235/492 |
| 7,299,330 B2 | 11/2007 | Gillingham et al. |
| 7,302,598 B2 | 11/2007 | Suzuki et al. |
| 7,307,863 B2 | 12/2007 | Yen et al. ........................ 365/63 |
| 7,317,250 B2 | 1/2008 | Koh et al. |
| 7,327,613 B2 | 2/2008 | Lee |
| 7,337,293 B2 | 2/2008 | Brittain et al. |
| 7,363,422 B2 | 4/2008 | Perego et al. ................. 711/105 |
| 7,366,947 B2 | 4/2008 | Gower et al. |
| 7,379,316 B2 | 5/2008 | Rajan |
| 7,386,656 B2 | 6/2008 | Rajan et al. |
| 7,392,338 B2 | 6/2008 | Rajan et al. |
| 7,408,393 B1 | 8/2008 | Jain et al. ..................... 327/202 |
| 7,409,492 B2 | 8/2008 | Tanaka et al. ................ 711/103 |
| 7,414,917 B2 | 8/2008 | Ruckerbauer et al. |
| 7,428,644 B2 | 9/2008 | Jeddeloh et al. |
| 7,437,579 B2 | 10/2008 | Jeddeloh et al. ............. 713/300 |
| 7,441,064 B2 | 10/2008 | Gaskins |
| 7,457,122 B2 | 11/2008 | Lai et al. |
| 7,464,225 B2 | 12/2008 | Tsern ............................ 711/115 |
| 7,472,220 B2 | 12/2008 | Rajan et al. ................... 711/103 |
| 7,474,576 B2 | 1/2009 | Co et al. |
| 7,480,147 B2 | 1/2009 | Hoss et al. |
| 7,480,774 B2 | 1/2009 | Ellis et al. |
| 7,496,777 B2 | 2/2009 | Kapil ............................ 713/324 |
| 7,515,453 B2 | 4/2009 | Rajan ............................. 365/63 |
| 7,532,537 B2 | 5/2009 | Solomon et al. ............. 365/230 |
| 7,539,800 B2 | 5/2009 | Dell et al. |
| 7,573,136 B2 | 8/2009 | Jiang et al. |
| 7,580,312 B2 | 8/2009 | Rajan et al. |
| 7,581,121 B2 | 8/2009 | Barth et al. |
| 7,581,127 B2 | 8/2009 | Rajan et al. |
| 7,590,796 B2 | 9/2009 | Rajan et al. |
| 7,599,205 B2 | 10/2009 | Rajan |
| 7,606,245 B2 | 10/2009 | Ma et al. |
| 7,609,567 B2 | 10/2009 | Rajan et al. |
| 7,613,880 B2 | 11/2009 | Miura et al. |
| 7,619,912 B2 | 11/2009 | Bhakta et al. |
| 7,724,589 B2 | 5/2010 | Rajan et al. |
| 7,730,338 B2 | 6/2010 | Rajan et al. |
| 7,761,724 B2 | 7/2010 | Rajan et al. |
| 7,934,070 B2 | 4/2011 | Brittain et al. |
| 7,990,797 B2 | 8/2011 | Moshayedi et al. |
| 8,116,144 B2 | 2/2012 | Shaw et al. |
| 2001/0000822 A1 | 5/2001 | Dell et al. |
| 2001/0003198 A1 | 6/2001 | Wu |
| 2001/0011322 A1* | 8/2001 | Stolt et al. ..................... 711/105 |
| 2001/0019509 A1 | 9/2001 | Aho et al. |
| 2001/0021106 A1 | 9/2001 | Weber et al. |
| 2001/0021137 A1 | 9/2001 | Kai et al. |
| 2001/0046129 A1 | 11/2001 | Broglia et al. |
| 2001/0046163 A1 | 11/2001 | Yanagawa |
| 2001/0052062 A1 | 12/2001 | Lipovski |
| 2002/0002662 A1 | 1/2002 | Olarig et al. |
| 2002/0004897 A1 | 1/2002 | Kao et al. |
| 2002/0015340 A1 | 2/2002 | Batinovich |
| 2002/0019961 A1 | 2/2002 | Blodgett |
| 2002/0034068 A1 | 3/2002 | Weber et al. |
| 2002/0038405 A1 | 3/2002 | Leddige et al. |
| 2002/0040416 A1 | 4/2002 | Tsern et al. |
| 2002/0041507 A1 | 4/2002 | Woo et al. |
| 2002/0051398 A1 | 5/2002 | Mizugaki ...................... 365/222 |
| 2002/0060945 A1 | 5/2002 | Ikeda |
| 2002/0060948 A1 | 5/2002 | Chang et al. |
| 2002/0064073 A1 | 5/2002 | Chien |
| 2002/0064083 A1 | 5/2002 | Ryu et al. |
| 2002/0089831 A1 | 7/2002 | Forthun |
| 2002/0089970 A1 | 7/2002 | Asada et al. |
| 2002/0094671 A1 | 7/2002 | Distefano et al. |
| 2002/0121650 A1 | 9/2002 | Minamio et al. |
| 2002/0121670 A1 | 9/2002 | Minamio et al. |
| 2002/0124195 A1 | 9/2002 | Nizar |
| 2002/0129204 A1 | 9/2002 | Leighnor et al. |
| 2002/0145900 A1 | 10/2002 | Schaefer |
| 2002/0165706 A1 | 11/2002 | Raynham ........................ 703/25 |
| 2002/0167092 A1 | 11/2002 | Fee et al. |
| 2002/0172024 A1 | 11/2002 | Hui et al. |
| 2002/0174274 A1 | 11/2002 | Wu et al. |
| 2002/0184438 A1 | 12/2002 | Usui |
| 2003/0002262 A1 | 1/2003 | Benisek et al. |
| 2003/0011993 A1 | 1/2003 | Summers et al. |
| 2003/0016550 A1 | 1/2003 | Yoo et al. |
| 2003/0021175 A1 | 1/2003 | Tae Kwak |
| 2003/0026155 A1* | 2/2003 | Yamagata ..................... 365/222 |
| 2003/0026159 A1 | 2/2003 | Frankowsky et al. |
| 2003/0035312 A1 | 2/2003 | Halbert et al. |
| 2003/0039158 A1 | 2/2003 | Horiguchi et al. |
| 2003/0041295 A1 | 2/2003 | Hou et al. |
| 2003/0061458 A1 | 3/2003 | Wilcox et al. |
| 2003/0061459 A1 | 3/2003 | Aboulenein et al. |
| 2003/0083855 A1 | 5/2003 | Fukuyama |
| 2003/0088743 A1 | 5/2003 | Rader |
| 2003/0093614 A1 | 5/2003 | Kohn et al. |
| 2003/0101392 A1 | 5/2003 | Lee |
| 2003/0105932 A1 | 6/2003 | David et al. |
| 2003/0110339 A1 | 6/2003 | Calvignac et al. |
| 2003/0117875 A1 | 6/2003 | Lee et al. |
| 2003/0123389 A1 | 7/2003 | Russell et al. |
| 2003/0126338 A1 | 7/2003 | Dodd et al. |
| 2003/0127737 A1 | 7/2003 | Takahashi |
| 2003/0131160 A1 | 7/2003 | Hampel et al. |
| 2003/0145163 A1 | 7/2003 | Seo et al. ...................... 711/106 |
| 2003/0158995 A1 | 8/2003 | Lee et al. |
| 2003/0164539 A1 | 9/2003 | Yau |
| 2003/0164543 A1 | 9/2003 | Kheng Lee |
| 2003/0174569 A1 | 9/2003 | Amidi |
| 2003/0182513 A1 | 9/2003 | Dodd et al. |
| 2003/0183934 A1 | 10/2003 | Barrett |
| 2003/0189868 A1 | 10/2003 | Riesenman et al. |
| 2003/0189870 A1 | 10/2003 | Wilcox |
| 2003/0191888 A1 | 10/2003 | Klein |
| 2003/0191915 A1 | 10/2003 | Saxena et al. |
| 2003/0200382 A1 | 10/2003 | Wells et al. |
| 2003/0200474 A1 | 10/2003 | Li |
| 2003/0205802 A1 | 11/2003 | Segaram et al. |
| 2003/0206476 A1 | 11/2003 | Joo |
| 2003/0217303 A1 | 11/2003 | Chua-Eoan et al. |
| 2003/0223290 A1 | 12/2003 | Park et al. ..................... 365/200 |
| 2003/0227798 A1 | 12/2003 | Pax |
| 2003/0229821 A1 | 12/2003 | Ma |
| 2003/0230801 A1 | 12/2003 | Jiang et al. |
| 2003/0231540 A1 | 12/2003 | Lazar et al. |
| 2003/0231542 A1 | 12/2003 | Zaharinova-Papazova et al. |
| 2003/0234664 A1 | 12/2003 | Yamagata |
| 2004/0016994 A1 | 1/2004 | Huang |
| 2004/0027902 A1 | 2/2004 | Ooishi et al. |
| 2004/0034732 A1 | 2/2004 | Valin et al. |
| 2004/0034755 A1 | 2/2004 | LaBerge et al. |
| 2004/0037133 A1 | 2/2004 | Park et al. ..................... 365/202 |
| 2004/0042503 A1 | 3/2004 | Shaeffer et al. |
| 2004/0044808 A1 | 3/2004 | Salmon et al. |
| 2004/0047228 A1 | 3/2004 | Chen |
| 2004/0049624 A1 | 3/2004 | Salmonsen |
| 2004/0057317 A1 | 3/2004 | Schaefer |
| 2004/0064647 A1 | 4/2004 | DeWhitt et al. |
| 2004/0064767 A1 | 4/2004 | Huckaby et al. |
| 2004/0083324 A1 | 4/2004 | Rabinovitz et al. |
| 2004/0088475 A1 | 5/2004 | Streif et al. |
| 2004/0100837 A1 | 5/2004 | Lee |
| 2004/0117723 A1 | 6/2004 | Foss |
| 2004/0123173 A1 | 6/2004 | Emberling et al. ........... 714/733 |
| 2004/0125635 A1 | 7/2004 | Kuzmenka |
| 2004/0133736 A1 | 7/2004 | Kyung ........................... 711/105 |
| 2004/0139359 A1 | 7/2004 | Samson et al. |
| 2004/0145963 A1 | 7/2004 | Byon |
| 2004/0151038 A1 | 8/2004 | Ruckerbauer et al. |
| 2004/0174765 A1 | 9/2004 | Seo et al. |
| 2004/0177079 A1 | 9/2004 | Gluhovsky et al. ........... 707/100 |
| 2004/0178824 A1 | 9/2004 | Pan |
| 2004/0184324 A1 | 9/2004 | Pax |

(56) References Cited

U.S. PATENT DOCUMENTS

| | | |
|---|---|---|
| 2004/0186956 A1 | 9/2004 | Perego et al. |
| 2004/0188704 A1 | 9/2004 | Halbert et al. |
| 2004/0195682 A1 | 10/2004 | Kimura |
| 2004/0196732 A1 | 10/2004 | Lee |
| 2004/0205433 A1 | 10/2004 | Gower et al. |
| 2004/0208173 A1 | 10/2004 | Di Gregoria ............ 370/360 |
| 2004/0225858 A1 | 11/2004 | Brueggen |
| 2004/0228166 A1 | 11/2004 | Braun et al. |
| 2004/0228196 A1 | 11/2004 | Kwak et al. |
| 2004/0228203 A1 | 11/2004 | Koo |
| 2004/0230932 A1 | 11/2004 | Dickmann |
| 2004/0236877 A1 | 11/2004 | Burton |
| 2004/0250989 A1 | 12/2004 | Im et al. |
| 2004/0256638 A1 | 12/2004 | Perego et al. |
| 2004/0257847 A1 | 12/2004 | Matsui et al. |
| 2004/0257857 A1 | 12/2004 | Yamamoto et al. |
| 2004/0260957 A1 | 12/2004 | Jeddeloh et al. |
| 2004/0264255 A1 | 12/2004 | Royer |
| 2004/0268161 A1 | 12/2004 | Ross |
| 2005/0018495 A1 | 1/2005 | Bhakta et al. |
| 2005/0021874 A1 | 1/2005 | Georgiou et al. |
| 2005/0024963 A1 | 2/2005 | Jakobs et al. |
| 2005/0027928 A1 | 2/2005 | Avraham et al. ............ 711/103 |
| 2005/0028038 A1 | 2/2005 | Pomaranski et al. |
| 2005/0034004 A1 | 2/2005 | Bunker et al. |
| 2005/0036350 A1 | 2/2005 | So et al. |
| 2005/0041504 A1 | 2/2005 | Perego et al. |
| 2005/0044302 A1 | 2/2005 | Pauley et al. |
| 2005/0044303 A1 | 2/2005 | Perego et al. |
| 2005/0044305 A1 | 2/2005 | Jakobs et al. |
| 2005/0047192 A1 | 3/2005 | Matsui et al. |
| 2005/0071543 A1 | 3/2005 | Ellis et al. |
| 2005/0078532 A1 | 4/2005 | Ruckerbauer et al. |
| 2005/0081085 A1 | 4/2005 | Ellis et al. |
| 2005/0086548 A1 | 4/2005 | Haid et al. |
| 2005/0099834 A1 | 5/2005 | Funaba et al. |
| 2005/0102590 A1 | 5/2005 | Norris et al. |
| 2005/0105318 A1 | 5/2005 | Funaba et al. |
| 2005/0108460 A1* | 5/2005 | David ............................. 711/5 |
| 2005/0127531 A1 | 6/2005 | Tay et al. |
| 2005/0132158 A1 | 6/2005 | Hampel et al. ............ 711/167 |
| 2005/0135176 A1 | 6/2005 | Ramakrishnan et al. |
| 2005/0138267 A1 | 6/2005 | Bains et al. |
| 2005/0138304 A1 | 6/2005 | Ramakrishnan et al. |
| 2005/0139977 A1 | 6/2005 | Nishio et al. |
| 2005/0141199 A1 | 6/2005 | Chiou et al. |
| 2005/0149662 A1 | 7/2005 | Perego et al. |
| 2005/0152212 A1 | 7/2005 | Yang et al. |
| 2005/0156934 A1 | 7/2005 | Perego et al. |
| 2005/0166026 A1 | 7/2005 | Ware et al. |
| 2005/0193163 A1 | 9/2005 | Perego et al. |
| 2005/0193183 A1 | 9/2005 | Barth et al. |
| 2005/0194676 A1 | 9/2005 | Fukuda et al. |
| 2005/0194991 A1 | 9/2005 | Dour et al. |
| 2005/0195629 A1 | 9/2005 | Leddige et al. |
| 2005/0201063 A1 | 9/2005 | Lee et al. |
| 2005/0204111 A1 | 9/2005 | Natarajan |
| 2005/0207255 A1 | 9/2005 | Perego et al. |
| 2005/0210196 A1 | 9/2005 | Perego et al. |
| 2005/0223179 A1 | 10/2005 | Perego et al. |
| 2005/0224948 A1 | 10/2005 | Lee et al. |
| 2005/0232049 A1 | 10/2005 | Park |
| 2005/0235119 A1 | 10/2005 | Sechrest et al. |
| 2005/0235131 A1 | 10/2005 | Ware |
| 2005/0237838 A1 | 10/2005 | Kwak et al. .................. 365/222 |
| 2005/0243635 A1 | 11/2005 | Schaefer |
| 2005/0246558 A1 | 11/2005 | Ku |
| 2005/0249011 A1 | 11/2005 | Maeda |
| 2005/0259504 A1 | 11/2005 | Murtugh et al. |
| 2005/0263312 A1 | 12/2005 | Bolken et al. |
| 2005/0265506 A1 | 12/2005 | Foss et al. |
| 2005/0269715 A1 | 12/2005 | Yoo |
| 2005/0278474 A1 | 12/2005 | Perersen et al. |
| 2005/0281096 A1 | 12/2005 | Bhakta et al. |
| 2005/0281123 A1 | 12/2005 | Bell et al. |
| 2005/0283572 A1 | 12/2005 | Ishihara |
| 2005/0285174 A1 | 12/2005 | Saito et al. |
| 2005/0286334 A1 | 12/2005 | Saito et al. |
| 2005/0289292 A1 | 12/2005 | Morrow et al. |
| 2005/0289317 A1 | 12/2005 | Liou et al. ............ 711/170 |
| 2006/0002201 A1 | 1/2006 | Janzen ............ 365/191 |
| 2006/0010339 A1 | 1/2006 | Klein |
| 2006/0026484 A1 | 2/2006 | Hollums ............ 714/746 |
| 2006/0038597 A1 | 2/2006 | Becker et al. |
| 2006/0039204 A1 | 2/2006 | Cornelius |
| 2006/0039205 A1 | 2/2006 | Cornelius |
| 2006/0041711 A1 | 2/2006 | Miura et al. |
| 2006/0041730 A1 | 2/2006 | Larson |
| 2006/0044909 A1 | 3/2006 | Kinsley et al. ............ 365/222 |
| 2006/0044913 A1 | 3/2006 | Klein et al. |
| 2006/0049502 A1 | 3/2006 | Goodwin et al. |
| 2006/0050574 A1 | 3/2006 | Streif et al. |
| 2006/0056244 A1 | 3/2006 | Ware ............ 365/194 |
| 2006/0062047 A1 | 3/2006 | Bhakta et al. |
| 2006/0067141 A1 | 3/2006 | Perego et al. |
| 2006/0085616 A1 | 4/2006 | Zeighami et al. |
| 2006/0087900 A1 | 4/2006 | Bucksch et al. |
| 2006/0090031 A1 | 4/2006 | Kirshenbaum et al. |
| 2006/0090054 A1 | 4/2006 | Choi et al. |
| 2006/0106951 A1 | 5/2006 | Bains ............ 710/5 |
| 2006/0112214 A1 | 5/2006 | Yeh |
| 2006/0112219 A1 | 5/2006 | Chawla et al. |
| 2006/0117152 A1 | 6/2006 | Amidi et al. ............ 711/154 |
| 2006/0117160 A1 | 6/2006 | Jackson et al. |
| 2006/0118933 A1 | 6/2006 | Haba |
| 2006/0120193 A1 | 6/2006 | Casper |
| 2006/0123265 A1 | 6/2006 | Ruckerbauer et al. |
| 2006/0126369 A1 | 6/2006 | Raghuram |
| 2006/0129712 A1 | 6/2006 | Raghuram |
| 2006/0129740 A1 | 6/2006 | Ruckerbauer et al. |
| 2006/0129755 A1 | 6/2006 | Raghuram |
| 2006/0133173 A1 | 6/2006 | Jain et al. |
| 2006/0136791 A1 | 6/2006 | Nierle |
| 2006/0149857 A1 | 7/2006 | Holman |
| 2006/0149982 A1 | 7/2006 | Vogt |
| 2006/0174082 A1 | 8/2006 | Bellows et al. |
| 2006/0176744 A1 | 8/2006 | Stave |
| 2006/0179262 A1 | 8/2006 | Brittain et al. |
| 2006/0179333 A1 | 8/2006 | Brittain et al. |
| 2006/0179334 A1 | 8/2006 | Brittain et al. |
| 2006/0180926 A1 | 8/2006 | Mullen et al. |
| 2006/0181953 A1 | 8/2006 | Rotenberg et al. ........ 365/230.06 |
| 2006/0195631 A1 | 8/2006 | Rajamani |
| 2006/0198178 A1 | 9/2006 | Kinsley et al. |
| 2006/0203590 A1 | 9/2006 | Mori et al. |
| 2006/0206738 A1 | 9/2006 | Jeddeloh et al. |
| 2006/0233012 A1 | 10/2006 | Sekiguchi et al. |
| 2006/0236165 A1 | 10/2006 | Cepulis et al. |
| 2006/0236201 A1 | 10/2006 | Gower et al. |
| 2006/0248261 A1 | 11/2006 | Jacob et al. |
| 2006/0248387 A1 | 11/2006 | Nicholson et al. |
| 2006/0262586 A1 | 11/2006 | Solomon et al. |
| 2006/0262587 A1 | 11/2006 | Matsui et al. |
| 2006/0277355 A1 | 12/2006 | Ellsberry et al. |
| 2006/0294295 A1 | 12/2006 | Fukuzo |
| 2007/0005998 A1 | 1/2007 | Jain et al. |
| 2007/0050530 A1 | 3/2007 | Rajan ............ 711/5 |
| 2007/0058471 A1 | 3/2007 | Rajan et al. ............ 365/222 |
| 2007/0070669 A1 | 3/2007 | Tsern |
| 2007/0088995 A1 | 4/2007 | Tsern et al. |
| 2007/0091696 A1 | 4/2007 | Niggemeier et al. |
| 2007/0106860 A1 | 5/2007 | Foster et al. ............ 711/170 |
| 2007/0136537 A1 | 6/2007 | Doblar et al. |
| 2007/0162700 A1 | 7/2007 | Fortin et al. |
| 2007/0188997 A1 | 8/2007 | Hockanson et al. |
| 2007/0192563 A1 | 8/2007 | Rajan et al. ............ 711/202 |
| 2007/0195613 A1 | 8/2007 | Rajan et al. ............ 365/189.05 |
| 2007/0204075 A1 | 8/2007 | Rajan et al. |
| 2007/0216445 A1 | 9/2007 | Raghavan et al. ............ 326/83 |
| 2007/0247194 A1 | 10/2007 | Jain ............ 326/87 |
| 2007/0279084 A1 | 12/2007 | Oh et al. |
| 2007/0288683 A1 | 12/2007 | Panabaker et al. |
| 2007/0288686 A1 | 12/2007 | Arcedera et al. ............ 711/103 |
| 2007/0288687 A1 | 12/2007 | Panabaker et al. |

(56) References Cited

U.S. PATENT DOCUMENTS

| | | | |
|---|---|---|---|
| 2008/0002447 A1 | 1/2008 | Gulachenski et al. | |
| 2008/0010435 A1 | 1/2008 | Smith et al. | |
| 2008/0025108 A1 | 1/2008 | Rajan et al. | 365/189.05 |
| 2008/0025122 A1 | 1/2008 | Schakel et al. | 365/222 |
| 2008/0025136 A1 | 1/2008 | Rajan et al. | 365/230.08 |
| 2008/0025137 A1 | 1/2008 | Rajan et al. | 365/239 |
| 2008/0027697 A1 | 1/2008 | Rajan et al. | 703/14 |
| 2008/0027702 A1 | 1/2008 | Rajan et al. | 703/21 |
| 2008/0027703 A1 | 1/2008 | Rajan et al. | 703/21 |
| 2008/0028135 A1 | 1/2008 | Rajan et al. | |
| 2008/0028136 A1 | 1/2008 | Schakel et al. | 711/106 |
| 2008/0028137 A1 | 1/2008 | Schakel et al. | |
| 2008/0031030 A1 | 2/2008 | Rajan et al. | 365/63 |
| 2008/0031072 A1 | 2/2008 | Rajan et al. | 365/227 |
| 2008/0034130 A1 | 2/2008 | Perego et al. | |
| 2008/0037353 A1 | 2/2008 | Rajan et al. | 365/227 |
| 2008/0056014 A1 | 3/2008 | Rajan et al. | 365/189.03 |
| 2008/0062773 A1 | 3/2008 | Rajan et al. | 365/189.03 |
| 2008/0065820 A1 | 3/2008 | Gillingham et al. | |
| 2008/0082763 A1 | 4/2008 | Rajan et al. | 711/154 |
| 2008/0086588 A1 | 4/2008 | Danilak et al. | |
| 2008/0089034 A1 | 4/2008 | Hoss et al. | |
| 2008/0098277 A1 | 4/2008 | Hazelzet | |
| 2008/0103753 A1 | 5/2008 | Rajan et al. | |
| 2008/0104314 A1 | 5/2008 | Rajan et al. | |
| 2008/0109206 A1 | 5/2008 | Rajan et al. | |
| 2008/0109595 A1 | 5/2008 | Rajan et al. | |
| 2008/0109597 A1 | 5/2008 | Schakel et al. | |
| 2008/0109598 A1 | 5/2008 | Schakel et al. | |
| 2008/0115006 A1 | 5/2008 | Smith et al. | 713/601 |
| 2008/0120443 A1 | 5/2008 | Rajan et al. | |
| 2008/0120458 A1 | 5/2008 | Gillingham et al. | |
| 2008/0123459 A1 | 5/2008 | Rajan et al. | 365/227 |
| 2008/0126624 A1 | 5/2008 | Prete et al. | |
| 2008/0126687 A1 | 5/2008 | Rajan et al. | |
| 2008/0126688 A1 | 5/2008 | Rajan et al. | |
| 2008/0126689 A1 | 5/2008 | Rajan et al. | |
| 2008/0126690 A1 | 5/2008 | Rajan et al. | 711/105 |
| 2008/0126692 A1 | 5/2008 | Rajan et al. | |
| 2008/0130364 A1 | 6/2008 | Guterman et al. | |
| 2008/0133825 A1 | 6/2008 | Rajan et al. | |
| 2008/0155136 A1 | 6/2008 | Hishino | |
| 2008/0159027 A1 | 7/2008 | Kim | |
| 2008/0170425 A1 | 7/2008 | Rajan | |
| 2008/0195894 A1 | 8/2008 | Schreck et al. | |
| 2008/0215832 A1 | 9/2008 | Allen et al. | |
| 2008/0239857 A1 | 10/2008 | Rajan et al. | 365/227 |
| 2008/0239858 A1 | 10/2008 | Rajan et al. | 365/227 |
| 2008/0256282 A1 | 10/2008 | Guo et al. | |
| 2008/0282084 A1 | 11/2008 | Hatakeyama | |
| 2008/0282341 A1 | 11/2008 | Hatakeyama | |
| 2009/0024789 A1 | 1/2009 | Rajan et al. | |
| 2009/0024790 A1 | 1/2009 | Rajan et al. | |
| 2009/0049266 A1 | 2/2009 | Kuhne | |
| 2009/0063865 A1 | 3/2009 | Berenbaum et al. | |
| 2009/0063896 A1 | 3/2009 | Lastras-Montano et al. | |
| 2009/0070520 A1 | 3/2009 | Mizushima | |
| 2009/0089480 A1 | 4/2009 | Wah et al. | |
| 2009/0109613 A1 | 4/2009 | Legen et al. | |
| 2009/0216939 A1 | 8/2009 | Smith et al. | |
| 2009/0285031 A1 | 11/2009 | Rajan et al. | |
| 2009/0290442 A1 | 11/2009 | Rajan | |
| 2010/0005218 A1 | 1/2010 | Gower et al. | |
| 2010/0020585 A1 | 1/2010 | Rajan | |
| 2010/0257304 A1 | 10/2010 | Rajan et al. | |
| 2010/0271888 A1 | 10/2010 | Rajan | |
| 2010/0281280 A1 | 11/2010 | Rajan et al. | |

FOREIGN PATENT DOCUMENTS

| | | |
|---|---|---|
| DE | 102005036528 | 2/2007 |
| EP | 0644547 | 3/1995 |
| JP | 62121978 | 6/1987 |
| JP | 01-171047 | 7/1989 |
| JP | 03-29357 | 2/1991 |
| JP | 03-276487 B2 | 12/1991 |
| JP | 03-286234 | 12/1991 |
| JP | 05-298192 | 11/1993 |
| JP | 07-141870 | 6/1995 |
| JP | 08-77097 | 3/1996 |
| JP | 11-149775 | 6/1999 |
| JP | 22025255 A2 | 1/2002 |
| JP | 3304893 B2 | 5/2002 |
| JP | 04-327474 | 11/2004 |
| JP | 2006236388 | 9/2006 |
| KR | 1020040062717 | 7/2004 |
| KR | 2005120344 | 12/2005 |
| WO | WO95/05676 | 2/1995 |
| WO | WO97/25674 | 7/1997 |
| WO | WO9900734 | 1/1999 |
| WO | WO00/45270 | 8/2000 |
| WO | WO01/90900 | 11/2001 |
| WO | WO01/97160 | 12/2001 |
| WO | WO2004/044754 | 5/2004 |
| WO | WO2004/051645 | 6/2004 |
| WO | WO2006/072040 | 7/2006 |
| WO | WO 2007002324 | 1/2007 |
| WO | WO2007/028109 | 3/2007 |
| WO | WO2007/038225 | 4/2007 |
| WO | WO2007/095080 | 8/2007 |
| WO | WO 2008063251 | 5/2008 |

OTHER PUBLICATIONS

Final Office Action from U.S. Appl. No. 11/461,435 mailed on Jan. 28, 2009.
Non-final Office Action from U.S. Appl. No. 11/461,437 mailed on Jan. 26, 2009.
Non-final Office Action from U.S. Appl. No. 11/939,432 mailed on Feb. 19, 2009.
Office Action from U.S. Appl. No. 11/461,427 mailed on Sep. 5, 2008.
Final Office Action from U.S. Appl. No. 11/461,430 mailed on Sep. 08, 2008.
Notice of Allowance from U.S. Appl. No. 11/474,075 mailed on Nov. 26, 2008.
Office Action from U.S. Appl. No. 11/474,076 mailed on Nov. 3, 2008.
Office Action from U.S. Appl. No. 11/524,811 mailed on Sep. 17, 2008.
German Office Action From German Patent Application No. 11 2006 002 300.4-55 Mailed Jun. 5, 2009 (With Translation).
Non-Final Office Action From U.S. Appl. No. 11/461,430 Mailed Feb. 19, 2009.
Final Office Action From U.S. Appl. No. 11/461,435 Mailed Jan. 28, 2009.
Non-Final Office Action From U.S. Appl. No. 11/461,437 Mailed Jan. 26, 2009.
Non-Final Office Action From U.S. Appl. No. 11/461,441 Mailed Apr. 2, 2009.
Non-Final Office Action From U.S. Appl. No. 11/611,374 Mailed Mar. 23, 2009.
Non-Final Office Action From U.S. Appl. No. 11/762,010 Mailed Mar. 20, 2009.
Non-Final Office Action From U.S. Appl. No. 11/939,432 Mailed Feb. 6, 2009.
Non-Final Office Action From U.S. Appl. No. 12/111,819 Mailed Apr. 27, 2009.
Non-Final Office Action From U.S. Appl. No. 12/111,828 Mailed Apr. 17, 2009.
Fang et al., W. Power Complexity Analysis of Adiabatic SRAM, 6th Int. Conference on ASIC, vol. 1, Oct. 2005, pp. 334-337.
Pavan et al., P. A Complete Model of E2PROM Memory Cells for Circuit Simulations, IEEE Transactions on Computer-Aided Design of Integrated Circuits and Systems, vol. 22, No. 8, Aug. 2003, pp. 1072-1079.
German Office Action From German Patent Application No. 11 2006 001 810.8-55 Mailed Apr. 20, 2009 (With Translation).

(56) References Cited

OTHER PUBLICATIONS

Final Rejection From U.S. Appl. No. 11/461,437 Mailed Nov. 10, 2009.
Final Rejection from U.S. Appl. No. 11/762,010 Mailed Dec. 4, 2009.
Non-Final Rejection from U.S. Appl. No. 11/672,921 Mailed Dec. 8, 2009.
Non-Final Rejection from U.S. Appl. No. 11/672,924 Mailed Dec. 14, 2009.
Non-Final Rejection from U.S. Appl. No. 11/929,225 Mailed Dec. 14, 2009.
Non-Final Rejection from U.S. Appl. No. 11/929,261 Mailed Dec. 14, 2009.
Notice of Allowance From U.S. Appl. No. 11/611,374 Mailed Nov. 30, 2009.
Notice of Allowance From U.S. Appl. No. 11/939,432 Mailed Dec. 1, 2009.
Notice of Allowance From U.S. Appl. No. 12/111,819 Mailed Nov. 20, 2009.
Notice of Allowance From U.S. Appl. No. 12/111,828 Mailed Dec. 15, 2009.
Great Britain Office Action from GB Patent Application No. GB0800734.6 Mailed Mar. 1, 2010.
Final Office Action from U.S. Appl. No. 11/461,420 Mailed Apr. 28, 2010.
Notice of Allowance from U.S. Appl. No. 11/553,372 Mailed Mar. 12, 2010.
Notice of Allowance from U.S. Appl. No. 11/553,399 Mailed Mar. 22, 2010.
Non-Final Office Action from U.S. Appl. No. 11/588,739 Mailed Dec. 29, 2009.
Notice of Allowance from U.S. Appl. No. 11/611,374 Mailed Apr. 5, 2010.
Non-Final Office Action from U.S. Appl. No. 11/828,181 Mailed Mar. 2, 2010.
Non-Final Office Action from U.S. Appl. No. 11/828,182 Mailed Mar. 29, 2010.
Final Office Action from U.S. Appl. No. 11/858,518 Mailed Apr. 21, 2010.
Non-Final Office Action from U.S. Appl. No. 11/929,432 Mailed Jan. 14, 2010.
Non-Final Office Action from U.S. Appl. No. 11/929,571 Mailed Mar. 3, 2010.
Non-Final Office Action from U.S. Appl. No. 11/929,636 Mailed Mar. 9, 2010.
Non-Final Office Action from U.S. Appl. No. 11/929,655 Mailed Mar. 3, 2010.
Non-Final Office Action from U.S. Appl. No. 11/939,432 Mailed Apr. 12, 2010.
Notice of Allowance from U.S. Appl. No. 12/111,819 Mailed Mar. 10, 2010.
Non-Final Office Action from U.S. Appl. No. 12/507,682 Mailed Mar. 8, 2010.
Notice of Allowance from U.S. Appl. No. 11/762,010 Dated Jun. 8, 2011.
Non-Final Office Action from U.S. Appl. No. 11/672,924 Dated Jun. 8, 2011.
Non-Final Office Action from U.S. Appl. No. 11/929,225 Dated Jun. 8, 2011.
Notice of Allowance from U.S. Appl. No. 11/929,500 Dated Jun. 13, 2011.
Notice of Allowance from U.S. Appl. No. 11/941,589 Dated Jun. 15, 2011.
Final Office Action from U.S. Appl. No. 12/057,306 Dated Jun. 15, 2011.
Final Office Action from U.S. Appl. No. 12/769,428 Dated Jun. 16, 2011.
Notice of Allowance from U.S. Appl. No. 12/203,100 Dated Jun. 17, 2011.
Notice of Allowance from U.S. Appl. No. 11/762,013 Dated Jun. 20, 2011.
Non-Final Office Action from U.S. Appl. No. 12/797,557 Dated Jun. 21, 2011.
Notice of Allowance from U.S. Appl. No. 11/929,483 Dated Jun. 23, 2011.
Non-Final Office Action from U.S. Appl. No. 11/702,960 Dated Jun. 23, 2011.
Non-Final Office Action from U.S. Appl. No. 11/929,655 Dated Jun. 24, 2011.
Notice of Allowance from U.S. Appl. No. 11/763,365 Dated Jun. 24, 2011.
Notice of Allowance from U.S. Appl. No. 11/611,374 Dated Jun. 24, 2011.
Notice of Allowance from U.S. Appl. No. 12/838,896 Dated Apr. 19, 2011.
Notice of Allowance from U.S. Appl. No. 11/702,981 Dated Apr. 25, 2011.
Notice of Allowance from U.S. Appl. No. 11/929,320 Dated May 5, 2011.
Final Office Action from U.S. Appl. No. 11/939,440 Dated May 19, 2011.
Final Office Action from Application No. 11/855,805, Dated May 26, 2011.
Non-Final Office Action from U.S. Appl. No. 11/672,921 Dated May 27, 2011.
Supplemental European Search Report and Search Opinion issued Sep. 21, 2009 in European Application No. 07870726.2, 8 pp.
Wu et al., 'eNVy: A Non-Volatile, Main Memory Storage System', ASPLOS-VI Proceedings, Oct. 4-7, 1994, pp. 86-97.
Buffer Device for Memory Modules (DIMM)', IP.com Prior Art Database, <URL: http://ip.com/IPCOM/000144850>, Feb. 10, 2007, 1 pg.
German Office Action from German Patent Application No. 11 2006 002 300.4-55 Dated May 11, 2009 (With Translation).
Great Britain Office Action from GB Patent Application No. GB0803913.3 Dated Mar. 1, 2010.
Preliminary Report on Patentability From PCT Application No. PCT/US06/24360 Dated on Jan. 10, 2008.
Written Opinion From PCT Application No. PCT/US06/24360 Dated on Jan. 8, 2007.
International Search Report From PCT Application No. PCT/US06/34390 Dated on Nov. 21, 2007.
Written Opinion From PCT Application No. PCT/US06/34390 Dated on Nov. 21, 2007.
International Preliminary Examination Report From PCT Application No. PCT/US07/016385 Dated Feb. 3, 2009.
Search Report and Written Opinion From PCT Application No. PCT/US07/03460 Dated on Feb. 14, 2008.
Search Report From PCT Application No. PCT/US10/038041 Dated Aug. 23, 2010.
Non-Final Office Action from Application No. 11/461,420 Dated Jul. 23, 2009.
Notice of Allowance from Application No. 11/461,430 Dated Sep. 10, 2009.
Non-Final Office Action from Application No. 11/461,435 Dated Aug. 5, 2009.
Final Office Action from Application No. 11/461,435 Dated May 13, 2010.
Non-Final Office Action from Application No. 11/461,437 Dated Jan. 4, 2011.
Non-Final Office Action from Application No. 11/515,167 Dated Sep. 25, 2009.
Final Office Action from Application No. 11/515,167 Dated Jun. 3, 2010.
Non-Final Office Action from Application No. 11/515,223 Dated Sep. 22, 2009.
Notice of Allowance from Application No. 11/515,223 Dated Jul. 30, 2010.
Notice of Allowance from Application No. 11/515,223 Dated Feb. 4, 2011.
Non-Final Office Action from Application No. 11/538,041 Dated Jun. 10, 2009.
Non-Final Office Action from Application No. 11/553,372 Dated Jun. 25, 2009.

(56) References Cited

OTHER PUBLICATIONS

Notice of Allowance from Application No. 11/553,372 Dated Sep. 30, 2009.
Notice of Allowance from Application No. 11/553,372 Dated Aug. 4, 2010.
Non-Final Office Action from Application No. 11/553,372 Dated Jan. 5, 2011.
Non-Final Office Action from Application No. 11/553,390 Dated Sep. 9, 2009.
Final Office Action from Application No. 11/553,390 Dated Jun. 24, 2010.
Non-Final Office Action from Application No. 11/553,399 Dated Jul. 7, 2009.
Notice of Allowance from Application No. 11/553,399 Dated Oct. 13, 2009.
Notice of Allowance from Application No. 11/553,399 Dated Dec. 3, 2010.
Final Office Action from Application No. 11/588,739 Dated Dec. 15, 2010.
Notice of Allowance from Application No. 11/611,374 Dated Sep. 15, 2009.
Notice of Allowance from Application No. 11/611,374 Dated Jul. 19, 2010.
Notice of Allowance from Application No. 11/611,374 Dated Oct. 29, 2010.
Final Office Action from Application No. 11/672,921 Dated Jul. 23, 2010.
Final Office Action from Application No. 11/672,924 Dated Sep. 7, 2010.
Non-Final Office Action from Application No. 11/702,960 Dated Sep. 25, 2009.
Final Office Action from Application No. 11/702,960 Dated Jun. 21, 2010.
Non-Final Office Action from Application No. 11/702,981 Dated Mar. 11, 2009.
Non-Final Office Action from Application No. 11/702,981 Dated Aug. 19, 2009.
Notice of Allowance from Application No. 11/762,010 Dated Jul. 2, 2010.
Notice of Allowance from Application No. 11/762,010 Dated Oct. 22, 2010.
Notice of Allowance from Application No. 11/762,010 Dated Feb. 18, 2011.
Non-Final Office Action from Application No. 11/762,013 Dated Jun. 5, 2009.
Notice of Allowance from Application No. 11/762,013 Dated Aug. 17, 2010.
Notice of Allowance from Application No. 11/762,013 Dated Dec. 7, 2010.
Non-Final Office Action from Application No. 11/763,365 Dated Oct. 28, 2009.
Notice of Allowance from Application No. 11/763,365 Dated Jun. 29, 2010.
Notice of Allowance from Application No. 11/763,365 Dated Oct. 20, 2010.
Non-Final Office Action from Application No. 11/828,181 Dated Mar. 2, 2010.
Final Office Action from Application No. 11/828,182 Dated Dec. 22, 2010.
Non-Final Office Action from Application No. 11/855,805 Dated Sep. 21, 2010.
Non-Final Office Action from Application No. 11/855,826 Dated Jan. 13, 2011.
Non-Final Office Action from Application No. 11/858,518 Dated Aug. 14, 2009.
Non-Final Office Action from Application No. 11/858,518 Dated Sep. 8, 2010.
Final Office Action from Application No. 11/929,225 Dated Aug. 27, 2010.
Final Office Action from Application No. 11/929,261 Dated Sep. 7, 2010.
Final Office Action from Application No. 11/929,286 Dated Aug. 20, 2010.
Notice of Allowance from Application No. 11/929,320 Dated Sep. 29, 2010.
Final Office Action from Application No. 11/929,403 Dated Aug. 31, 2010.
Final Office Action from Application No. 11/929,417 Dated Aug. 31, 2010.
Final Office Action from Application No. 11/929,432 Dated Aug. 20, 2010.
Final Office Action from Application No. 11/929,450 Dated Aug. 20, 2010.
Notice of Allowance from Application No. 11/929,483 Dated Oct. 7, 2010.
Non-Final Office Action from Application No. 11/929,500 Dated Oct. 13, 2009.
Final Office Action from Application No. 11/929,500 Dated Jun. 24, 2010.
Final Office Action from Application No. 11/929,655 Dated Nov. 22, 2010.
Notice of Allowance from Application No. 11/939,432 Dated Sep. 24, 2009.
Notice of Allowance from Application No. 11/939,432 Dated Feb. 18, 2011.
Non-Final Office Action from Application No. 11/939,440 Dated Sep. 17, 2010.
Non-Final Office Action from Application No. 11/941,589 Dated Oct. 1, 2009.
Notice of Allowance from Application No. 11/941,589 Dated Oct. 25, 2010.
Non-Final Office Action from Application No. 12/057,306 Dated Oct. 8, 2010.
Notice of Allowance from Application No. 12/144,396 Dated Feb. 1, 2011.
Non-Final Office Action from Application No. 12/203,100 Dated Dec. 1, 2010.
Non-Final Office Action from Application No. 12/574,628 Dated Jun. 10, 2010.
Non-Final Office Action from Application No. 12/769,428 Dated Nov. 8, 2010.
Non-Final Office Action from Application No. 12/816,756 Dated Feb. 7, 2011.
Non-Final Office Action from Application No. 12/838,896 Dated Sep. 3, 2010.
Notice of Allowance from Application No. 11/762,013 Dated Feb. 22, 2011.
Notice of Allowance from Application No. 11/929,500 Dated Feb. 24, 2011.
Notice of Allowance from Application No. 11/763,365 Dated Mar. 1, 2011.
Final Office Action from Application No. 12/574,628 Dated Mar. 3, 2011.
Final Office Action from Application No. 11/929,571 Dated Mar. 3, 2011.
Notice of Allowance from Application No. 11/611,374 Dated Mar. 4, 2011.
Notice of Allowance from Application No. 11/929,483 Dated Mar. 4, 2011.
Notice of Allowance from Application No. 11/553,399 Dated Mar. 18, 2011.
Final Office Action from Application No. 12/507,682 Dated Mar. 29, 2011.
Non-Final Office Action from Application No. 11/929,403 Dated Mar. 31, 2011.
Non-Final Office Action from Application No. 11/929,417 Dated Mar. 31, 2011.
Office Action, including English translation, from co-pending Japanese application No. 2008-529353, Dated Jul. 31, 2012.
Final Office Action from U.S. Appl. No. 13/315,933, Dated Aug. 24, 2012.

(56) References Cited

OTHER PUBLICATIONS

Final Office Action from U.S. Appl. No. 13/276,212, Dated Aug. 30, 2012.
Non-Final Office Action from U.S. Appl. No. 13/367,182, Dated Aug. 31, 2012.
Notice of Allowance from U.S. Appl. No. 11/461,420, Dated Sep. 5, 2012.
Final Office Action from U.S. Appl. No. 13/280,251, Dated Sep. 12, 2012.
Non-Final Office Action from U.S. Appl. No. 11/929,225, Dated Sep. 17, 2012.
Notice of Allowance from U.S. Appl. No. 12/508,496, Dated Sep. 17, 2012.
Non-Final Office Action from U.S. Appl. No. 11/672,921, Dated Oct. 1, 2012.
Notice of Allowance from U.S. Appl. No. 12/057,306, Dated Oct. 10, 2012.
Notice Allowance from U.S. Appl. No. 12/144,396, Dated Oct. 11, 2012.
Non-Final Office Action from U.S. Appl. No. 13/411,489, Dated Oct. 17, 2012.
Non-Final Office Action from U.S. Appl. No. 13/471,283, Dated Dec. 7, 2012.
English translation of Office Action from co-pending Korean patent application No. KR1020087005172, dated Dec. 20, 2012.
Office Action, including English translation, from co-pending Japanese application No. 2008-529353, Dated Dec. 27, 2012.
Office Action from co-pending European patent application No. EP12150798, Dated Jan. 3, 2013.
Final Office Action from U.S. Appl. No. 11/672,924, Dated Feb. 1, 2013.
Non-Final Office Action from U.S. Appl. No. 13/260,650, Dated Feb. 1, 2013.
Notice of Allowance from U.S. Appl. No. 13/141,844, Dated Feb. 5, 2013.
Non-Final Office Action from U.S. Appl. No. 11/828,182 Dated Jun. 27, 2011.
Non-Final Office Action from U.S. Appl. No. 11/828,181 Dated Jun. 27, 2011.
Non-Final Office Action from U.S. Appl. No. 12/378,328 Dated Jul. 15, 2011.
Final Office Action from U.S. Appl. No. 11/461,420 Dated Jul. 20, 2011.
Notice of Allowance from U.S. Appl. No. 11/461,437 Dated Jul. 25, 2011.
Notice of Allowance from U.S. Appl. No. 11/702,981 Dated Aug. 5, 2011.
Notice of Allowability from U.S. Appl. No. 11/855,826 Dated Aug. 15, 2011.
Non-Final Office Action from U.S. Appl. No. 12/574,628 Dated Sep. 20, 2011.
Non-Final Office Action from U.S. Appl. No. 11/858,518 Dated Sep. 27, 2011.
Notice of Allowance from U.S. Appl. No. 11/929,571 Dated Sep. 27, 2011.
Notice of Allowance from U.S. Appl. No. 11/929,500 Dated Sep. 27, 2011.
Notice of Allowance from U.S. Appl. No. 11/941,589 Dated Sep. 30, 2011.
Notice of Allowance from U.S. Appl. No. 12/816,756 Dated Oct. 3, 2011.
Non-Final Office Action from U.S. Appl. No. 12/508,496 Dated Oct. 11, 2011.
Non-Final Office Action from U.S. Appl. No. 11/588,739 Dated Oct. 13, 2011.
Notice of Allowance from U.S. Appl. No. 11/939,432 Dated Oct. 24, 2011.
Non-Final Office Action from U.S. Appl. No. 11/929,631 Dated Nov. 1, 2011.
Non-Final Office Action from U.S. Appl. No. 11/553,372 Dated Nov. 14, 2011.
Notice of Allowance from U.S. Appl. No. 11/515,223 Dated Nov. 29, 2011.
Notice of Allowance from U.S. Appl. No. 12/769,428 Dated Nov. 28, 2011.
Final Office Action from U.S. Appl. No. 11/939,440 Dated Dec. 12, 2011.
Notice of Allowance from U.S. Appl. No. 12/797,557 Dated Dec. 28, 2011.
Office Action, including English translation, from co-pending Japanese application No. 2008-529353, Dated Jan. 10, 2012.
Notice of Allowance from U.S. Appl. No. 12/838,896 Dated Jan. 18, 2012.
Final Office Action from U.S. Appl. No. 11/929,655 Dated Jan. 19, 2012.
Final Office Action from U.S. Appl. No. 12/378,328 Dated Feb. 3, 2012.
Final Office Action from U.S. Appl. No. 11/672,921 Dated Feb. 16, 2012.
Final Office Action from U.S. Appl. No. 11/672,924 Dated Feb. 16, 2012.
Final Office Action from U.S. Appl. No. 11/929,225 Dated Feb. 16, 2012.
International Search Report for Application No. EP12150807 Dated Feb. 16, 2012.
Final Office Action from U.S. Appl. No. 11/828,181 Dated Feb. 23, 2012.
Non-Final Office Action from U.S. Appl. No. 11/461,520 Dated Feb. 29, 2012.
Notice of Allowance from U.S. Appl. No. 12/574,628 Dated Mar. 6, 2012.
Non-Final Office Action from U.S. Appl. No. 13/276,212 Dated Mar. 15, 2012.
Non-Final Office Action from U.S. Appl. No. 13/343,612 Dated Mar. 29, 2012.
Notice of Allowance from U.S. Appl. No. 11/939,440 Dated Mar. 30, 2012.
European Search Report from co-pending European application No. 11194876.6-2212/2450798, Dated Apr. 12, 2012.
European Search Report from co-pending European application No. 11194862.6-2212/2450800, Dated Apr. 12, 2012.
Notice of Allowance from U.S. Appl. No. 11/929,636, Dated Apr. 17, 2012.
Final Office Action from U.S. Appl. No. 11/858,518, Dated Apr. 17, 2012.
European Search Report from co-pending European application No. 11194883.2-2212, Dated Apr. 27, 2012.
Non-Final Office Action from U.S. Appl. No. 11/553/372, Dated May 3, 2012.
Notice of Allowance from U.S. Appl. No. 11/929,631, Dated May 3, 2012.
Non-Final Office Action from U.S. Appl. No. 13/165,713, Dated May 22, 2012.
Non-Final Office Action from U.S. Appl. No. 12/144,396, Dated May 29, 2012.
Non-Final Office Action from U.S. Appl. No. 13/165,713, Dated May 31, 2012.
Non-Final Office Action from U.S. Appl. No. 13/280,251, Dated Jun. 12, 2012.
Final Office Action from U.S. Appl. No. 11/855,805, Dated Jun. 14, 2012.
Notice of Allowance from U.S. Appl. No. 13/473,827, Dated Feb. 15, 2013.
Notice of Allowance from U.S. Appl. No. 12/378,328, Dated Feb. 27, 2013.
Non-Final Office Action from U.S. Appl. No. 13/536,093, Dated Mar. 1, 2013.
Office Action from co-pending Japanese patent application No. 2012-132119, Dated Mar. 6, 2013.
Notice of Allowance from U.S. Appl. No. 11/461,435, Dated Mar. 6, 2013.

(56) References Cited

OTHER PUBLICATIONS

Notice of Allowance from U.S. Appl. No. 11/515,223, Dated Mar. 18, 2013.
Notice of Allowance from U.S. Appl. No. 13/471,283, Dated Mar. 21, 2013.
Extended European Search Report for co-pending European patent application No. EP12150807.1, dated Feb. 1, 2013, mailed Mar. 22, 2013.
Notice of Allowance from U.S. Appl. No. 13/181,716, Dated Apr. 3, 2013.
English translation of Office Action from co-pending Korean patent application No. KR1020087019582, Dated Mar. 13, 2013.
Notice of Allowance from U.S. Appl. No. 13/618,246, Dated Apr. 23, 2013.
Notice of Allowance from U.S. Appl. No. 13/182,234, Dated May 1, 2013.
Final Office Action from U.S. Appl. No. 13/315,933, Dated May 3, 2013.
English Translation of Office Action from co-pending Korean patent application No. 10-2013-7004006, Dated Apr. 12, 2013.
Non-Final Office Action from U.S. Appl. No. 13/620,793, Dated May 6, 2013.
Non-Final Office Action from U.S. Appl. No. 13/620,565, Dated May 24, 2013.
Final Office Action from U.S. Appl. No. 11/929,225, Dated May 24, 2013.
Final Office Action from U.S. Appl. No. 11/672,921, Dated May 24, 2013.
Notice of Allowance from U.S. Appl. No. 11/929,631, Dated May 28, 2013.
Notice of Allowance from U.S. Appl. No. 13/620,424, Dated May 29, 2013.
Notice of Allowance from U.S. Appl. No. 13/341,844, Dated May 30, 2013.
Non-Final Office Action from U.S. Appl. No. 13/455,691, Dated Jun. 4, 2013.
Non-Final Office Action from U.S. Appl. No. 13/620,199, Dated Jun. 17, 2013.
Non-Final Office Action from U.S. Appl. No. 13/620,207, Dated Jun. 20, 2013.
Non-Final Office Action from U.S. Appl. No. 11/828,182, Dated Jun. 20, 2013.
Final Office Action from U.S. Appl. No. 11/828,181, Dated Jun. 20, 2013.
Notice of Allowance from U.S. Appl. No. 13/597,895, Dated Jun. 25, 2013.
Non-Final Office Action from U.S. Appl. No. 13/620,645, Dated Jun. 26, 2013.
Notice of Allowance from U.S. Appl. No. 13/471,283, Dated Jun. 28, 2013.
Notice of Allowance from U.S. Appl. No. 13/181,747, Dated Jul. 9, 2013.
Notice of Allowance from U.S. Appl. No. 11/515,223, Dated Jul. 18, 2013.
Notice of Allowance from U.S. Appl. No. 13/182,234, Dated Jul. 22, 2013.
Notice of Allowance from U.S. Appl. No. 13/181,716, Dated Jul. 22, 2013.
Non-Final Office Action from U.S. Appl. No. 13/620,233, Dated Aug. 2, 2013.
Final Office Action from U.S. Appl. No. 13/367,182, Dated Aug. 8, 2013.
Notice of Allowance from U.S. Appl. No. 13/615,008, Dated Aug. 15, 2013.
Notice of Allowance from U.S. Appl. No. 13/620,425, Dated Aug. 20, 2013.
Non-Final Office Action from U.S. Appl. No. 13/620,601, Dated Aug. 23, 2013.

\* cited by examiner

REFRESH MANAGEMENT OF MEMORY MODULES

CROSS-REFERENCE TO RELATED APPLICATIONS

This application is a continuation of the U.S. patent application Ser. No. 11/828,181, filed on Jul. 25, 2007, which is a continuation-in-part of the U.S. patent application Ser. No. 11/584,179, filed on Oct. 20, 2006 now U.S. Pat. No. 7,581,127, which is a continuation of the U.S. patent application Ser. No. 11/524,811, filed on Sep. 20, 2006 now U.S. Pat. No. 7,590,796, which is a continuation-in-part of the U.S. patent application Ser. No. 11/461,439, filed on Jul. 31, 2006 now U.S. Pat. No. 7,580,312. Application Ser. No. 11/828,181 also claims the priority benefit of U.S. Provisional Patent Application No. 60/823,229, filed on Aug. 22, 2006. The subject matter the above related applications is hereby incorporated herein by reference. However, insofar as any definitions, information used for claim interpretation, etc. from the above parent application conflict with that set forth herein, such definitions, information, etc. in the present application should apply.

BACKGROUND OF THE INVENTION

1. Field of the Invention

Embodiments of the present invention generally relate to memory modules and, more specifically, to methods and apparatus for refresh management of memory modules.

2. Description of the Related Art

The storage capacity of memory systems is increasing rapidly due to various trends in computing, such as the introduction of 64-bit processors, multi-core processors, and advanced operating systems. Such memory systems may include one or more memory devices, such as, for example, dynamic random access memory (DRAM) devices. The cells of a typical DRAM device can retain data for a time period ranging from several seconds to tens of seconds, but to ensure that the data is properly retained and not lost, DRAM manufacturers usually specify a very low threshold for instituting a refresh operation. The specification for most modern memory systems containing DRAM devices is that the cells of the DRAM devices are refreshed once every 64 milliseconds. This means that each cell in a given DRAM device must be read out to the sense amplifier and then written back into the DRAM device at full signal strength once every 64 milliseconds. Furthermore, for some DRAM devices, to account for the effect of higher signal loss rate at higher temperature, the refresh rate is doubled when the device is operating above a standard temperature, typically above 85° C.

To simplify the task of ensuring that all DRAM cells are properly refreshed, most DRAM devices, including double data rate (DDR) and DDR2 synchronous DRAM (SDRAM) devices, have an internal refresh row address register that keeps track of the row identification (ID) of the last refreshed row. Typically, a memory controller sends a single refresh command to the DRAM device. Subsequently, the DRAM device increments the row ID in the refresh row address register and executes a sequence of standard steps (typically referred to a "row cycle") to refresh the data contained in DRAM cells of all rows with the appropriate row ID's in all of the banks in the DRAM device.

With the advent of higher capacity DRAM devices, there are more cells to refresh. Thus, to properly refresh all DRAM cells in a higher capacity DRAM device, either the refresh operations need to be performed more frequently or more cells need to be refreshed with each refresh command. To simplify memory controller design, the choice made by DRAM device manufacturers and memory controller designers is to keep the frequency of refresh operations the same, but refresh more DRAM cells for each refresh operation for the higher capacity DRAM devices. However, one issue associated with the action of refreshing more DRAM devices for each refresh operation in the higher capacity DRAM devices is that larger electrical currents may be drawn by the higher capacity DRAM devices for each refresh operation.

As the foregoing illustrates, what is needed in the art are new techniques for refreshing multiple memory devices in a memory system. In particular, higher capacity DRAM devices that must refresh a large number of DRAM cells for each refresh command.

SUMMARY OF THE INVENTION

One embodiment sets forth an interface circuit configured to manage refresh command sequences. The interface circuit includes a system interface adapted to receive a refresh command from a memory controller, clock frequency detection circuitry configured to determine the timing for issuing staggered refresh commands to two or more memory devices coupled to the interface circuit based on the refresh command received from the memory controller, and at least two refresh command sequence outputs configured to generate the staggered refresh commands for the two or more memory devices.

BRIEF DESCRIPTION OF THE DRAWINGS

So that the manner in which the above recited features can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Illustrative information will now be set forth regarding various optional architectures and features of different embodiments with which the foregoing frameworks may or may not be implemented, per the desires of the user. It should be strongly noted that the following information is set forth for illustrative purposes and should not be construed as limiting in any manner. Any of the following features may be optionally incorporated with or without the other features described.

Figure 1A:
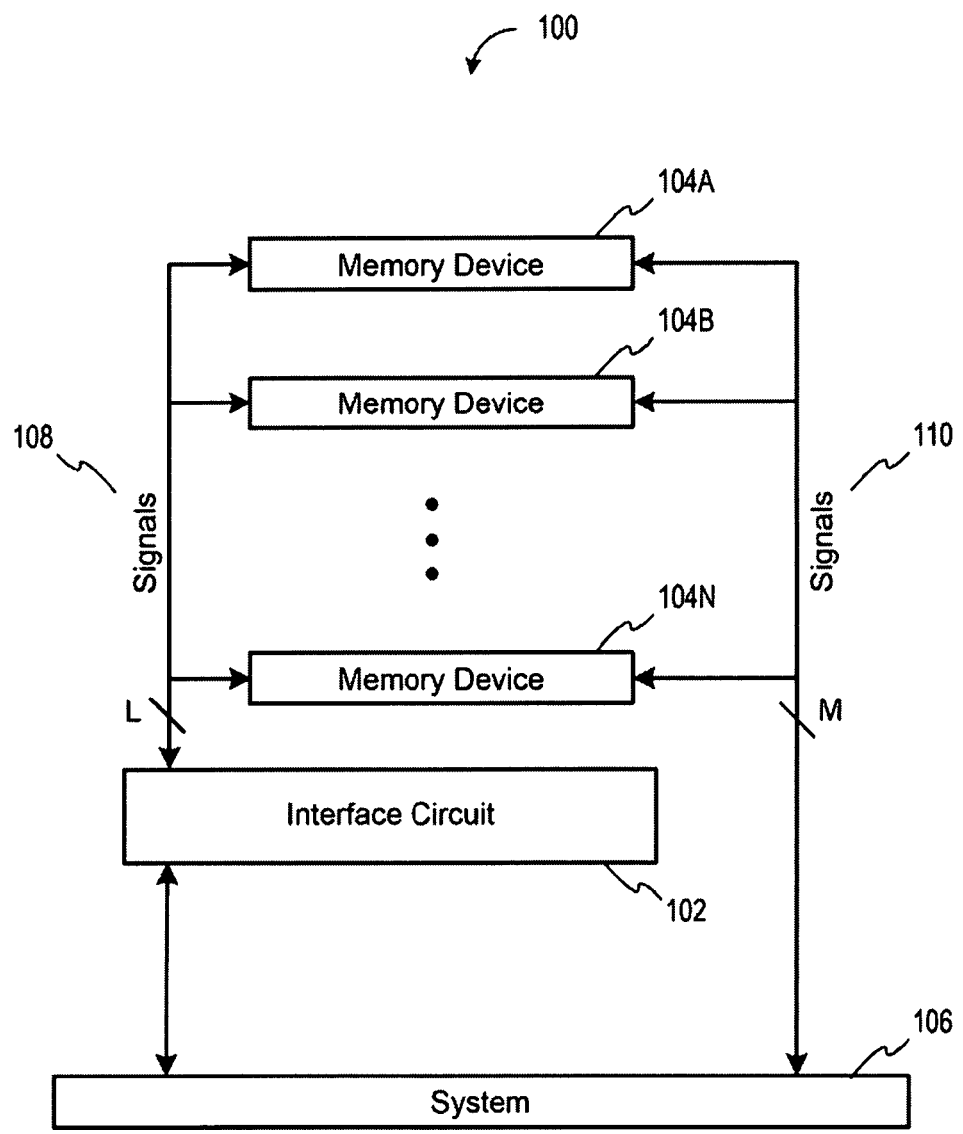
FIG. 1A illustrates a multiple memory device system, according to one embodiment.

FIG. 1A illustrates a multiple memory device system 100, according to one embodiment. As shown, the multiple memory device system 100 includes, without limitation, a system device 106 coupled to an interface circuit 102, which is, in turn, coupled to a plurality of physical memory devices 104A-N. The memory devices 104A-N may be any type of memory devices. For example, in various embodiments, one or more of the memory devices 104A, 104B, 104N may include a monolithic memory device. For instance, such monolithic memory device may take the form of dynamic random access memory (DRAM). Such DRAM may take any form including, but not limited to synchronous (SDRAM), double data rate synchronous (DDR DRAM, DDR2 DRAM, DDR3 DRAM, etc.), quad data rate (QDR DRAM), direct RAMBUS (DRDRAM), fast page mode (FPM DRAM), video (VDRAM), extended data out (EDO DRAM), burst EDO (BEDO DRAM), multibank (MDRAM), synchronous graphics (SGRAM), and/or any other type of DRAM. Of course, one or more of the memory devices 104A, 104B, 104N may include other types of memory such as magnetic random access memory (MRAM), intelligent random access memory (IRAM), distributed network architecture (DNA) memory, window random access memory (WRAM), flash memory (e.g. NAND, NOR, or others, etc.), pseudostatic random access memory (PSRAM), wetware memory, and/or any other type of memory device that meets the above definition. In some embodiments, each of the memory devices 104A-N is a separate memory chip. For example, each may be a DDR2 DRAM.

Figure 1B:
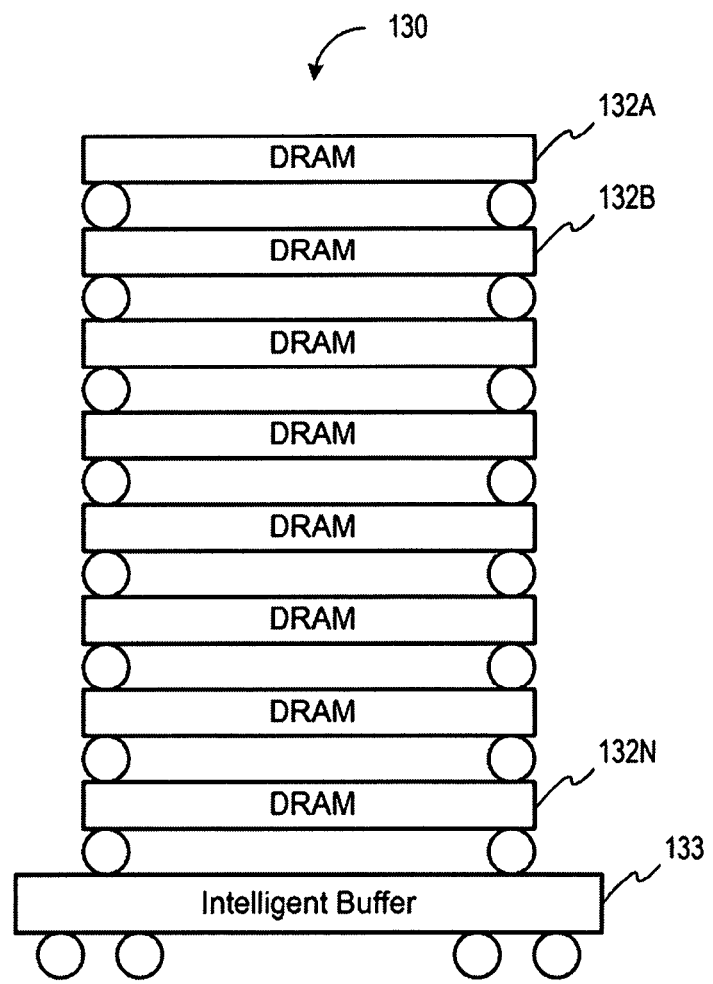
FIG. 1B illustrates a memory stack, according to one embodiment.

In some embodiments, the any of the memory devices 104A-N may itself be a group of memory devices, or may be a group in the physical orientation of a stack. For example, FIG. 1B shows a memory device 130 which is comprised of a group of DRAM memory devices 132A-132N all electrically interconnected to each other and an intelligent buffer 133. In alternative embodiments, the intelligent buffer 133 may include the functionality of interface circuit 102. Further, the memory device 130 may be included in a DIMM (dual in-line memory module) or other type of memory module.

The memory devices 1032A-N may be any type of memory devices. Furthermore, in some embodiments, the memory devices 104A-N may be symmetrical, meaning each has the same capacity, type, speed, etc., while in other embodiments they may be asymmetrical. For ease of illustration only, three such memory devices are shown, 104A, 104B, and 104N, but actual embodiments may use any plural number of memory devices. As will be discussed below, the memory devices 104A-N may optionally be coupled to a memory module (not shown), such as a DIMM.

The system device 106 may be any type of system capable of requesting and/or initiating a process that results in an access of the memory devices 104A-N. The system device 106 may include a memory controller (not shown) through which the system device 106 accesses the memory devices 104A-N.

The interface circuit 102 may include any circuit or logic capable of directly or indirectly communicating with the memory devices 104A-N, such as, for example, an interface circuit advanced memory buffer (AMB) chip or the like. The interface circuit 102 interfaces a plurality of signals 108 between the system device 106 and the memory devices 104A-N. The signals 108 may include, for example, data signals, address signals, control signals, clock signals, and the like. In some embodiments, all of the signals 108 communicated between the system device 106 and the memory devices 104A-N are communicated via the interface circuit 102. In other embodiments, some other signals, shown as signals 110, are communicated directly between the system device 106 (or some component thereof, such as a memory controller or an AMB) and the memory devices 104A-N, without passing through the interface circuit 102. In some embodiments, the majority of signals are communicated via the interface circuit 102, such that L>M.

As will be explained in greater detail below, the interface circuit 102 presents to the system device 106 an interface to emulate memory devices which differ in some aspect from the physical memory devices 104A-N that are actually present within system 100. The terms "emulating," "emulated," "emulation," and the like are used herein to signify any type of emulation, simulation, disguising, transforming, converting, and the like, that results in at least one characteristic of the memory devices 104A-N appearing to the system device 106 to be different than the actual, physical characteristic of the memory devices 104A-N. For example, the interface circuit 102 may tell the system device 106 that the number of emulated memory devices is different than the actual number of physical memory devices 104A-N. In various embodiments, the emulated characteristic may be electrical in nature, physical in nature, logical in nature, pertaining to a protocol, etc. An example of an emulated electrical characteristic might be a signal or a voltage level. An example of an emulated physical characteristic might be a number of pins or wires, a number of signals, or a memory capacity. An example of an emulated protocol characteristic might be timing, or a specific protocol such as DDR3.

In the case of an emulated signal, such signal may be an address signal, a data signal, or a control signal associated with an activate operation, pre-charge operation, write operation, mode register set operation, refresh operation, etc. The interface circuit 102 may emulate the number of signals, type of signals, duration of signal assertion, and so forth. In addition, the interface circuit 102 may combine multiple signals to emulate another signal.

The interface circuit 102 may present to the system device 106 an emulated interface, for example, a DDR3 memory device, while the physical memory devices 104A-N are, in fact, DDR2 memory devices. The interface circuit 102 may emulate an interface to one version of a protocol, such as DDR2 with 3-3-3 latency timing, while the physical memory chips 104A-N are built to another version of the protocol, such as DDR with 5-5-5 latency timing. The interface circuit 102 may emulate an interface to a memory having a first capacity that is different than the actual combined capacity of the physical memory devices 104A-N.

An emulated timing signal may relate to a chip enable or other refresh signal. Alternatively, an emulated timing signal may relate to the latency of, for example, a column address strobe latency ($t_{CAS}$), a row address to column address latency ($t_{RCD}$), a row precharge latency ($t_{RP}$), an activate to precharge latency ($t_{RAS}$), and so forth.

The interface circuit 102 may be operable to receive a signal 107 from the system device 106 and communicate the signal 107 to one or more of the memory devices 104A-N after a delay (which may be hidden from the system device 106). In one embodiment, such a delay may be fixed, while in other embodiments, the delay may be variable. If variable, the delay may depend on e.g. a function of the current signal or a previous signal, a combination of signals, or the like. The delay may include a cumulative delay associated with any one or more of the signals. The delay may result in a time shift of the signal 107 forward or backward in time with respect to other signals. Different delays may be applied to different signals. The interface circuit 102 may similarly be operable to receive the signal 108 from one of the memory devices 104A-N and communicate the signal 108 to the system device 106 after a delay.

The interface circuit 102 may take the form of, or incorporate, or be incorporated into, a register, an AMB, a buffer, or the like, and may comply with JEDEC standards, and may have forwarding, storing, and/or buffering capabilities.

In one embodiment, the interface circuit 102 may perform multiple operations when a single operation is commanded by the system device 106, where the timing and sequence of the multiple operations are performed by the interface circuit 102 to the one or more of the memory devices without the knowledge of the system device 106. One such operation is a refresh operation. In the situation where the refresh operations are issued simultaneously, a large parallel load is presented to the power supply. To alleviate this load, multiple refresh operations could be staggered in time, thus reducing instantaneous load on the power supply. In various embodiments, the multiple memory device system 100 shown in FIG. 1A may include multiple memory devices 104A-N capable of being independently refreshed by the interface circuit 102. The interface circuit 102 may identify one or more of the memory devices 104A-N which are capable of being refreshed independently, and perform the refresh operation on those memory devices. In yet another embodiment, the multiple memory device system 100 shown in FIG. 1A includes the memory devices 104A-N which may be physically oriented in a stack, with each of the memory devices 104A-N capable to read/write a single bit. For example, to implement an eight-bit wide memory in a stack, eight one-bit wide memory devices 104A-N could be arranged in a stack of eight memory devices. In such a case, it may be desirable to control the refresh cycles of each of the memory devices 104A-N independently.

The interface circuit 102 may include one or more devices which together perform the emulation and related operations. In various embodiments, the interface circuit may be coupled or packaged with the memory devices 104A-N, or with the system device 106 or a component thereof, or separately. In one embodiment, the memory devices and the interface circuit are coupled to a DIMM. In alternative embodiments, the memory devices 104 and/or the interface circuit 102 may be coupled to a motherboard or some other circuit board within a computing device.

Figure 1C:
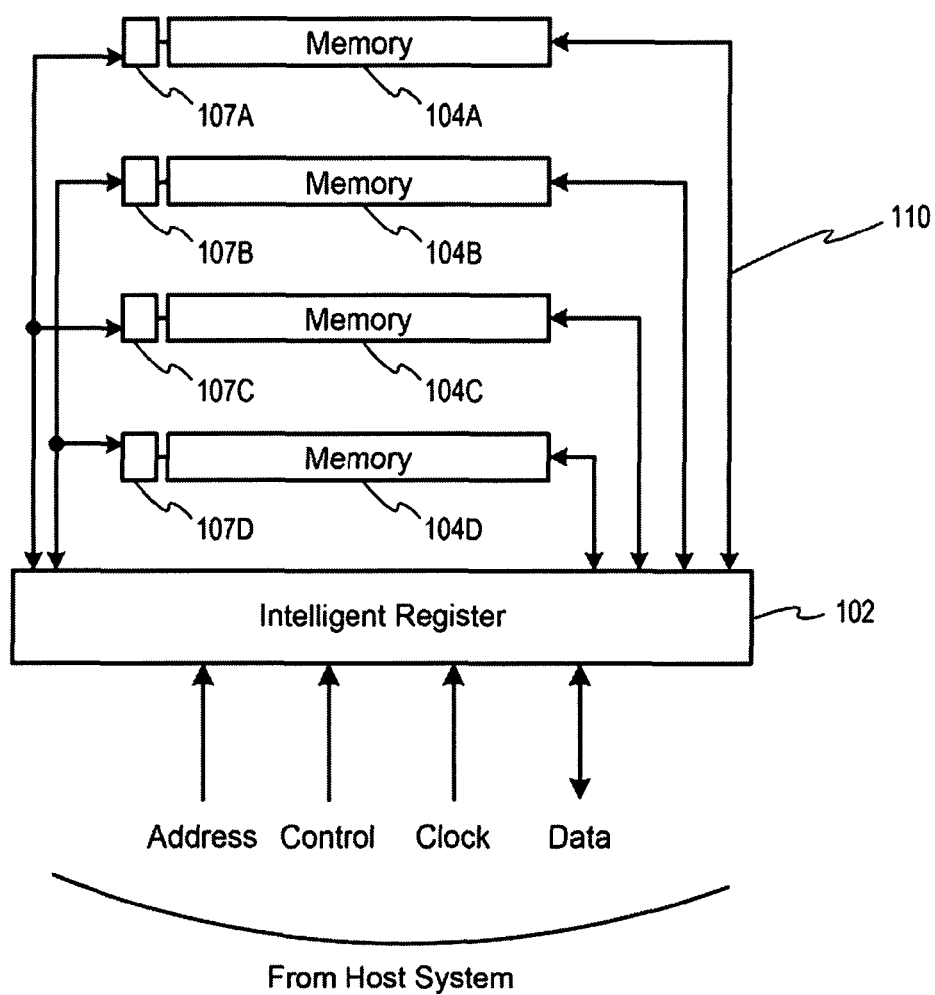
FIG. 1C illustrates a multiple memory device system, according to one embodiment that includes both an intelligent register and a intelligent buffer.

FIG. 1C illustrates a multiple memory device system, according to one embodiment. As shown, the multiple memory device system includes, without limitation, a host system device coupled to an host interface circuit, also known as an intelligent register circuit 102, which is, in turn, coupled to a plurality of intelligent buffer circuits 107A-107D, memory devices which is, in turn, coupled to a plurality of physical memory devices 104A-N.

Figure 2:
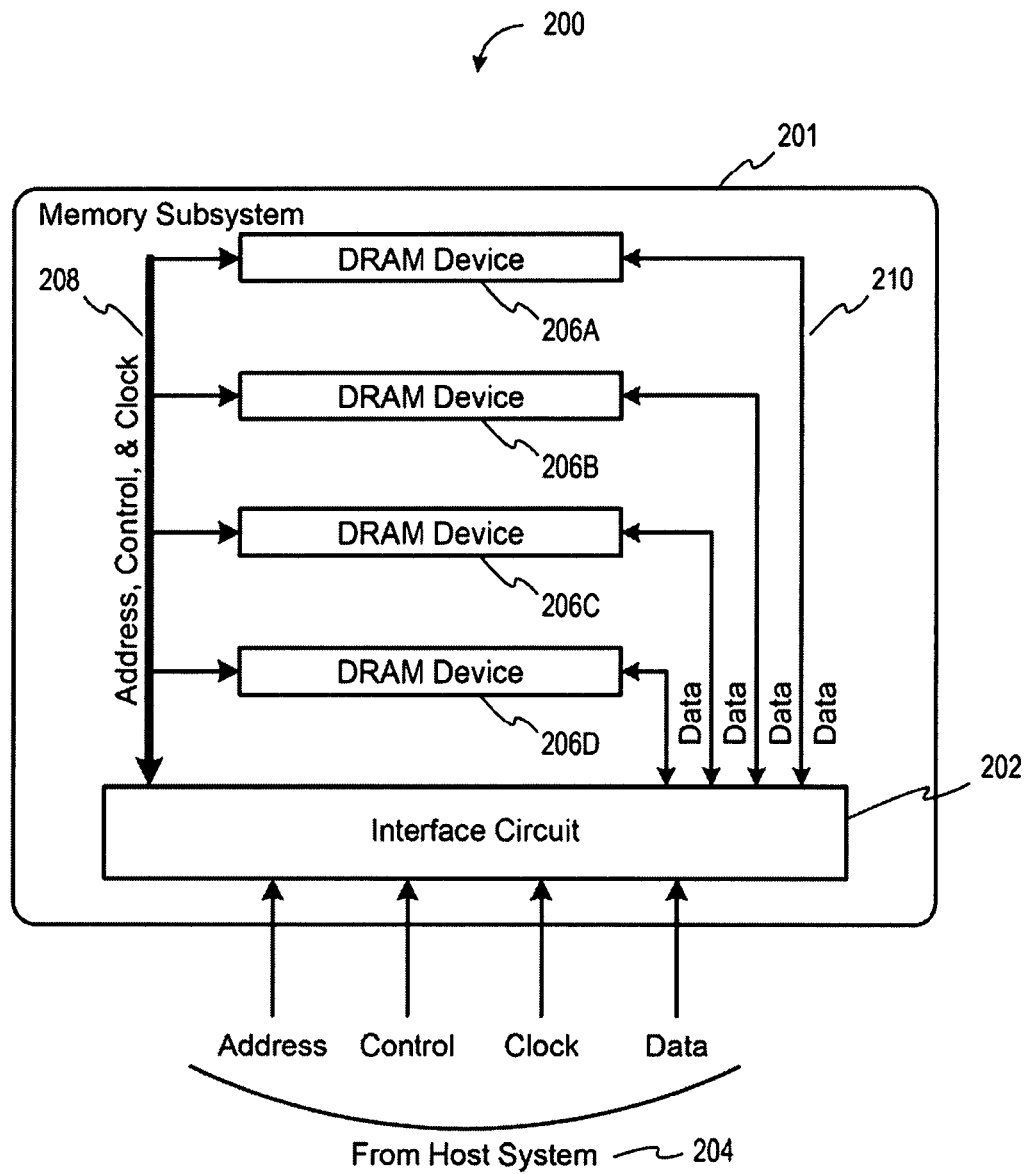
FIG. 2 illustrates a multiple memory device system, according to another embodiment.

FIG. 2 illustrates a multiple memory device system 200, according to another embodiment. As shown, the multiple memory device system 200 includes, without limitation, a system device 204 which communicates address, control, and clock signals 208 and data signals 210 with a memory subsystem 201. The memory subsystem 201 includes an interface circuit 202, which presents the system device 204 with an emulated interface to emulated memory, and a plurality of physical memory devices, which are shown as DRAM 06A-D. In one embodiment, the DRAM devices 206A-D are stacked, and the interface circuit 202 is electrically disposed between the DRAM devices 206A-D and the system device 204. Although the embodiments described here show the stack consisting of multiple DRAM circuits, a stack may refer to any collection of memory devices (e.g., DRAM circuits, flash memory devices, or combinations of memory device technologies, etc.).

The interface circuit 202 may buffer signals between the system device 204 and the DRAM devices 206A-D, both electrically and logically. For example, the interface circuit 202 may present to the system device 204 an emulated interface to present the memory as though the memory comprised a smaller number of larger capacity DRAM devices, although, in actuality, the memory subsystem 201 includes a larger number of smaller capacity DRAM devices 206A-D. In another embodiment, the interface circuit 202 presents to the system device 204 an emulated interface to present the memory as though the memory were a smaller (or larger) number of larger capacity DRAM devices having more configured (or fewer configured) ranks, although, in actuality, the physical memory is configured to present a specified number of ranks. Although the FIG. 2 shows four DRAM devices 206A-D, this is done for ease of illustration only. In other embodiments, other numbers of DRAM devices may be used.

As also shown in FIG. 2, the interface circuit 202 is coupled to send address, control, and clock signals 208 to the DRAM devices 206A-D via one or more buses. In the embodiment shown, each of the DRAM devices 206A-D has its own, dedicated data path for sending and receiving data signals 210 to and from the interface circuit 202. Also, in the embodiment shown, the DRAM devices 206A-D are physically arranged on a single side of the interface circuit 202.

In one embodiment, the interface circuit 202 may be a part of the stack of the DRAM devices 206A-D. In other embodiments, the interface circuit 202 may be the bottom-most chip in the stack or otherwise disposed in or on the stack, or may be separate from the stack.

In some embodiments, the interface circuit 202 may perform operations whose relative timing and ordering are executed without the knowledge of the system device 204. One such operation is a refresh operation. The interface circuit 202 may identify one or more of the DRAM devices 206A-D that should be refreshed concurrently when a single refresh operation is issued by the system device 204 and perform the refresh operation on those DRAM devices. The methods and apparatuses capable of performing refresh operations on a plurality of memory devices are described later herein.

In general, it is desirable to manage the application of refresh operations such that the current draw and voltage levels remain within acceptable limits. Such limits may depend on the number and type of the memory devices being refreshed, physical design characteristics, and the characteristics of the system device (e.g., system devices 106, 204.)

Figure 3:
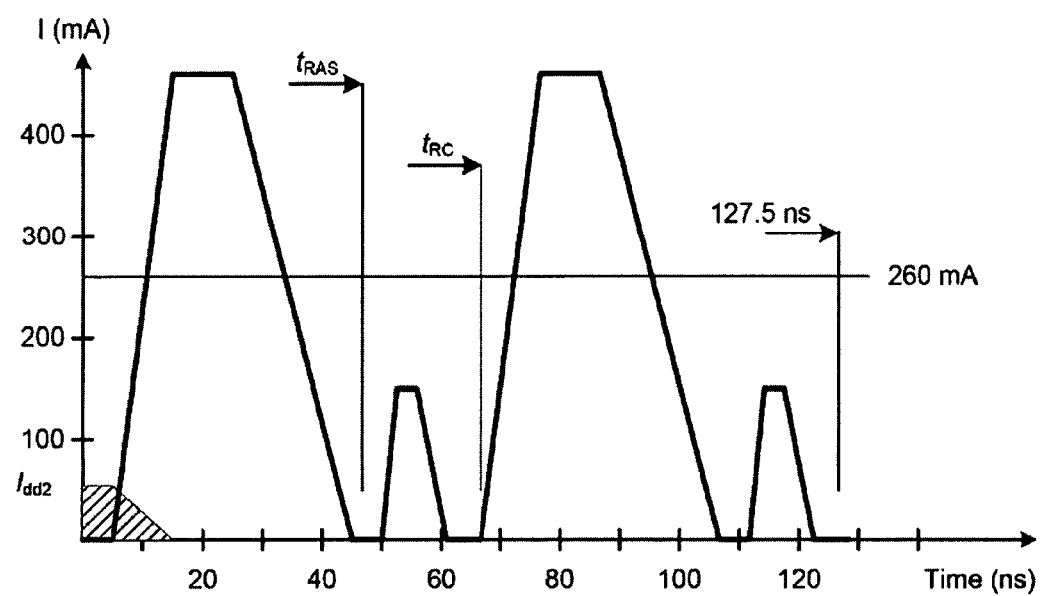
FIG. 3 illustrates an idealized current draw as a function of time for a refresh cycle of a single memory device that executes two internal refresh cycles for each external refresh command, according to one embodiment.

FIG. 3 illustrates an idealized current draw as a function of time for a refresh cycle of a single memory device that executes two internal refresh cycles for each external refresh command, according to one embodiment. The single memory device may be, for example, one of the memory devices 104A-N described in FIG. 1A or one of the DRAM devices described in FIG. 2.

FIG. 3 also shows several time periods, in particular, $t_{RAS}$, and $t_{RC}$. There is relatively less current draw during the 35 ns period between 40 ns and 75 ns as compared with the 35 ns period between 5 ns and 40 ns. Thus, in the specific case of managing refresh cycles independently for two memory devices (or independently for two banks), the instantaneous current draw can be minimized by staggering the beginning of the refresh cycles of the individual memory devices. In such an embodiment, the peak current draw for two independent, staggered refresh cycles of the two memory devices is reduced by starting the second refresh cycle at about 30 ns. However, in practical (non-idealized) systems, the optimal start time for a second or any subsequent refresh cycle may be a function of time as well as a function of many variables other than time.

Figure 4A:
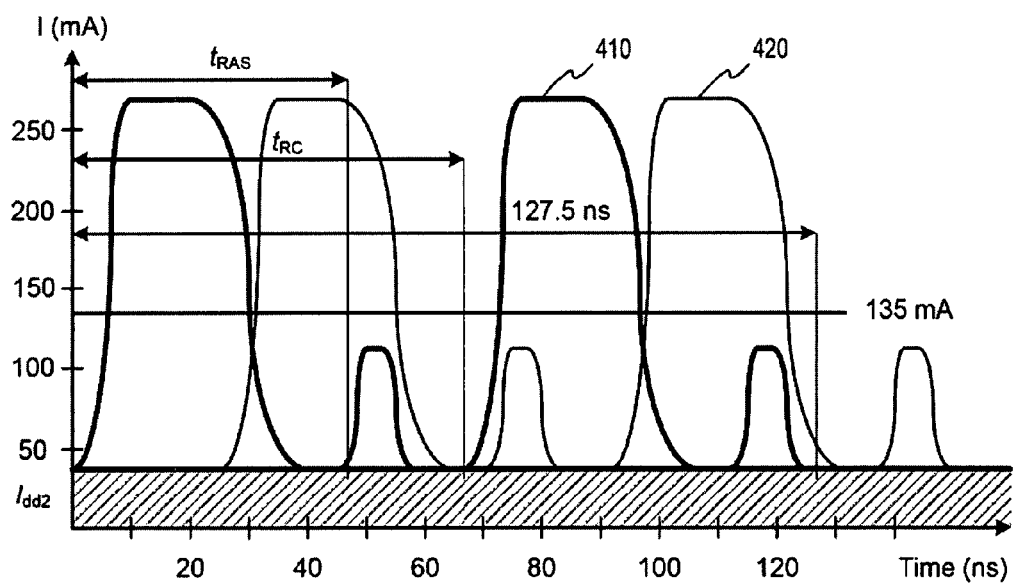
FIG. 4A illustrates current draw as a function of time for two refresh cycles, started independently and staggered by a time period of half of the period of a single refresh cycle, according to another embodiment.

FIG. 4A illustrates current draw as a function of time for two refresh cycles 410 and 420, started independently and staggered by a time period of half of the period of a single refresh cycle.

Figure 4B:
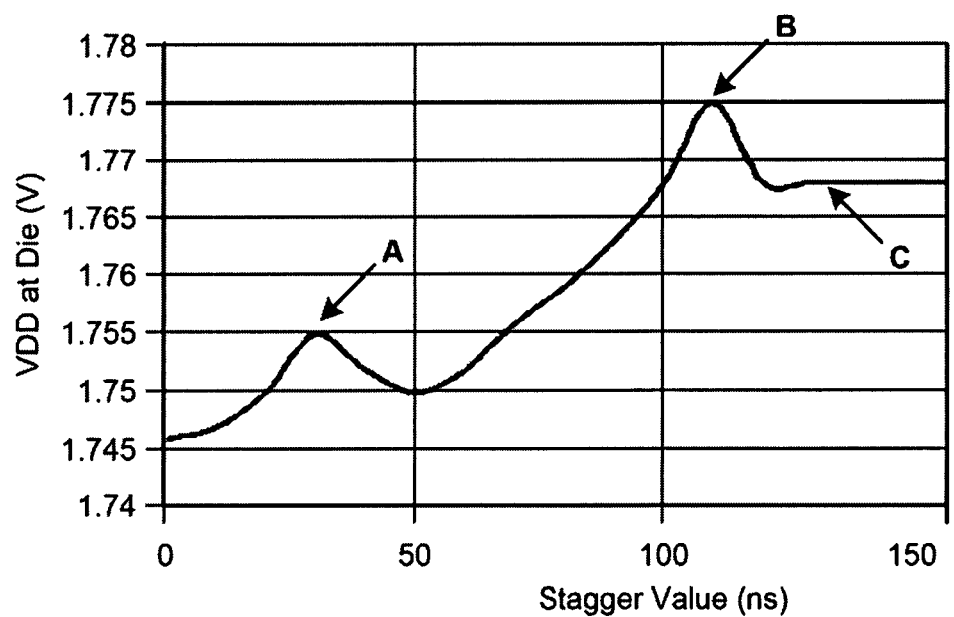
FIG. 4B illustrates voltage droop as a function of a stagger offset for two refresh cycles, according to one embodiment.

FIG. 4B illustrates voltage droop on the VDD voltage supply from the nominal voltage of 1.8 volt as a function of a stagger offset for two refresh cycles, according to one embodiment. "Stagger offset" is defined herein as the difference between the starting times of the first and second refresh cycles.

A curve of the voltage droop on the VDD voltage supply from the nominal voltage of 1.8 volt as a function of the stagger offset as shown in FIG. 4B can be generated from simulation models of the interconnect components and the interconnect itself, or can be dynamically calculated from measurements. Three distinct regions become evident in this curve:

A: A local minimum in the voltage droop on the VDD voltage supply from the nominal voltage of 1.8 volt results when the refreshes are staggered by an offset such that the increasing current transient from one refresh event counters the decreasing current transient from another refresh event. The positive slew rate from one refresh produces destructive interference with the negative slew rate from another refresh, thus reducing the effective load.

B: The best case, namely when the droop is minimum, occurs when the current draw profiles have almost zero overlap.

C: Once the waveforms are separated in time so that the refresh cycles do not overlap additional stagger spacing does not offer significant additional relief to the power delivery system. Consequently, thereafter, the level of voltage droop on the VDD supply voltage remains nearly constant.

As can be seen from a simple inspection, the optimal time to begin the second refresh cycle is at the point of minimum voltage droop (highest voltage), point B, which in this example is at about 110 ns. Persons skilled in the art will understand that the values used in the calculations resulting in the curve of FIG. 4B are for illustrative purposes only, and that a large number of other curves with different points of minimum voltage droop are possible, depending on the characteristics of the memory device, and the electrical characteristics of the physical design of the memory subsystem.

Figure 5:
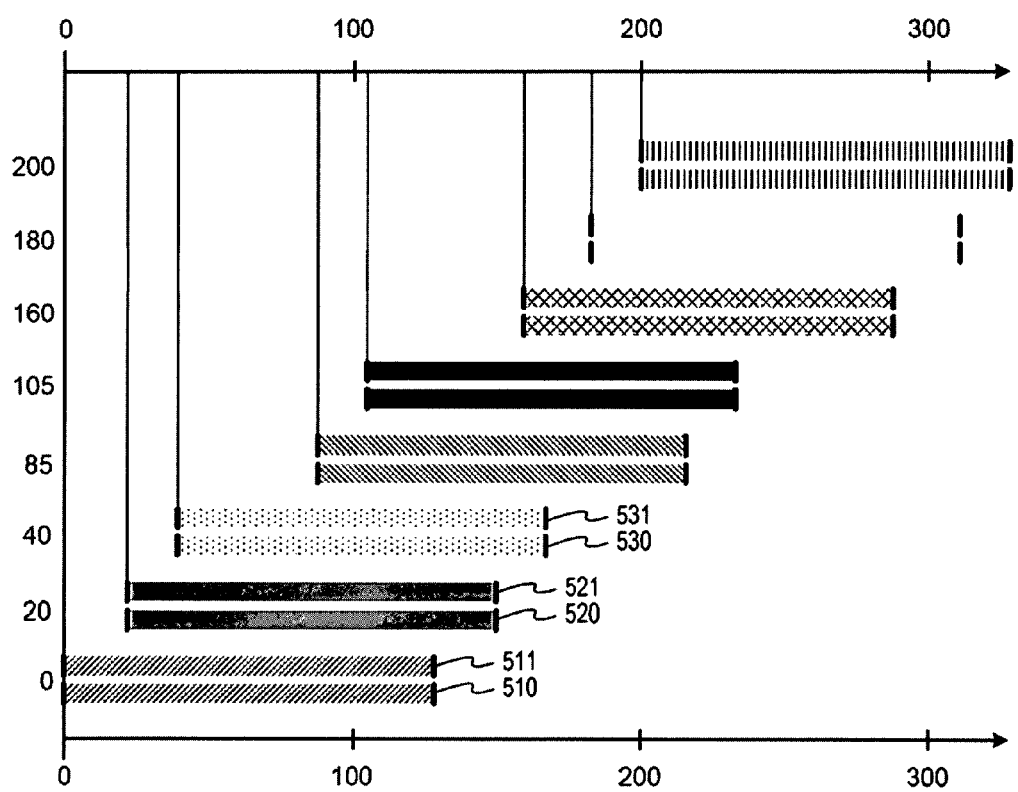
FIG. 5 illustrates the start and finish times of eight independent refresh cycles, according to one embodiment.

FIG. 5 illustrates the start and finish times of eight independent refresh cycles, according to one embodiment of the present application. The optimization of the start times of successive independent refresh cycles may be accomplished by circuit simulation (e.g., SPICE™ or H-SPICE as sold by Cadence Design Systems) or with logic-oriented timing analysis tools (e.g. Verilog™ as sold by Cadence Design Systems). Alternatively, the start times of the independent refresh cycles may be optimized dynamically through implementation of a dynamic parameter extraction capability. For example, the interface circuit 202 may contain a clock frequency detection circuit that the interface circuit 202 can use to determine the optimal timing for the independent refresh cycles. In the example of FIG. 5, the first independently controlled duple of cycles 510 and 511 begins at time zero. The next independently controlled duple of cycles, cycles 520 and 521, begins approximately at time 25 nS, and the next duple at approximately 37 nSec. In this example, current draw is reduced inasmuch as each next duple of refresh cycles does not begin until such time as the peak current draw of the previous duple has passed. This simplified regime is for illustrative purposes, and one skilled in the art will recognize that other regimes would emerge depending on the characteristic shape of the current draw during a refresh cycle.

In some embodiments, multiple instances of a memory device may be organized to form memory words that are longer than a single instance of the aforementioned memory device. In such a case, it may be convenient to control the independent refresh cycles of the multiple instances of the memory device that form such a memory word with multiple independently controlled memory refresh commands, with a separate refresh command sequence corresponding to each different instance of the memory device.

Figure 6:
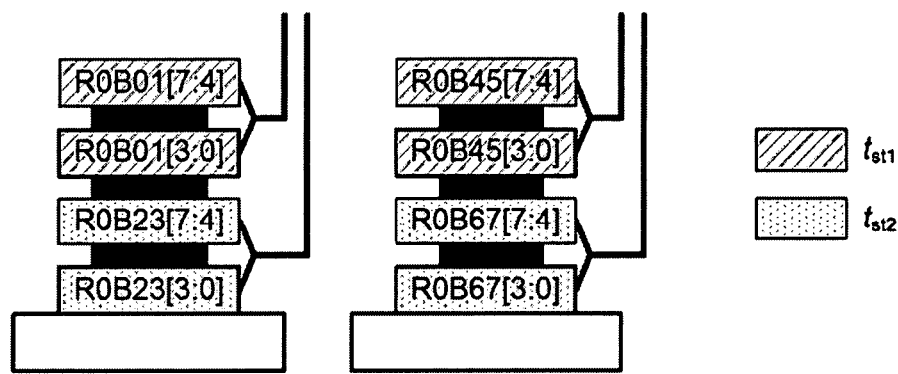
FIG. 6 illustrates a configuration of eight memory devices refreshed by two independently controlled refresh cycles starting at times $t_{ST1}$ and $t_{ST2}$, respectively, according to one embodiment.

FIG. 6 illustrates a configuration of eight memory devices refreshed by two independently controlled refresh cycles starting at times $t_{ST1}$ and $t_{ST2}$, respectively, according to one embodiment. The motivation for the refresh schedule is to minimize voltage droop while completing all refresh operations with the allotted time window, as per JEDEC specifications.

As shown, the eight memory devices are organized into two DRAM stacks, and each DRAM stack is driven by two independently controllable refresh command sequences. The memory devices labeled R0B01[7:4], R0B01[3:0], R1B45[7:4], and R1B45[3:0] are refreshed by refresh cycle $t_{ST1}$, while the remaining memory devices are refreshed by the refresh cycle $t_{ST2}$.

Figure 7:
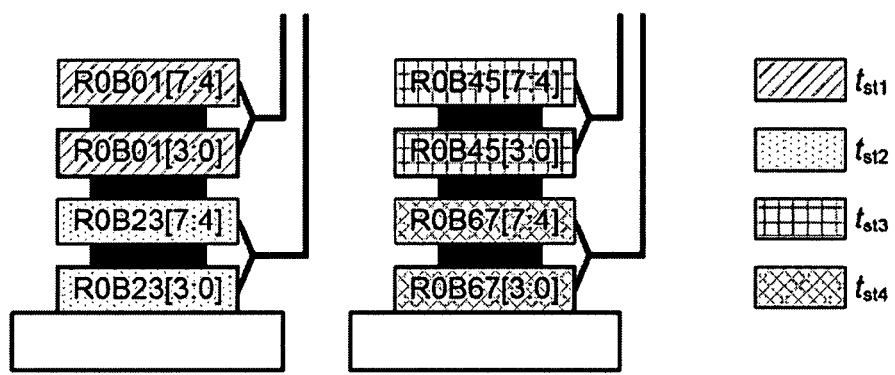
FIG. 7 illustrates a configuration of eight memory devices refreshed by four independently controlled refresh cycles starting at times $t_{ST1}$, $t_{ST2}$, $t_{ST3}$ and $t_{ST4}$, respectively, according to another embodiment.

FIG. 7 illustrates a configuration of eight memory devices refreshed by four independently controlled refresh cycles starting at $t_{ST1}$, $t_{ST2}$, $t_{ST3}$ and $t_{ST4}$, respectively, according to another embodiment. Such a configuration is referred to herein as a "quad configuration," and the stagger offsets in this configuration are referred to as "quad-stagger." The quad-stagger allows for four independent stagger times distributed over eight devices, thus spreading out the total current draw and lowering large slews that may result from simultaneous activation of refresh cycles in all eight DRAM devices.

Figure 8:
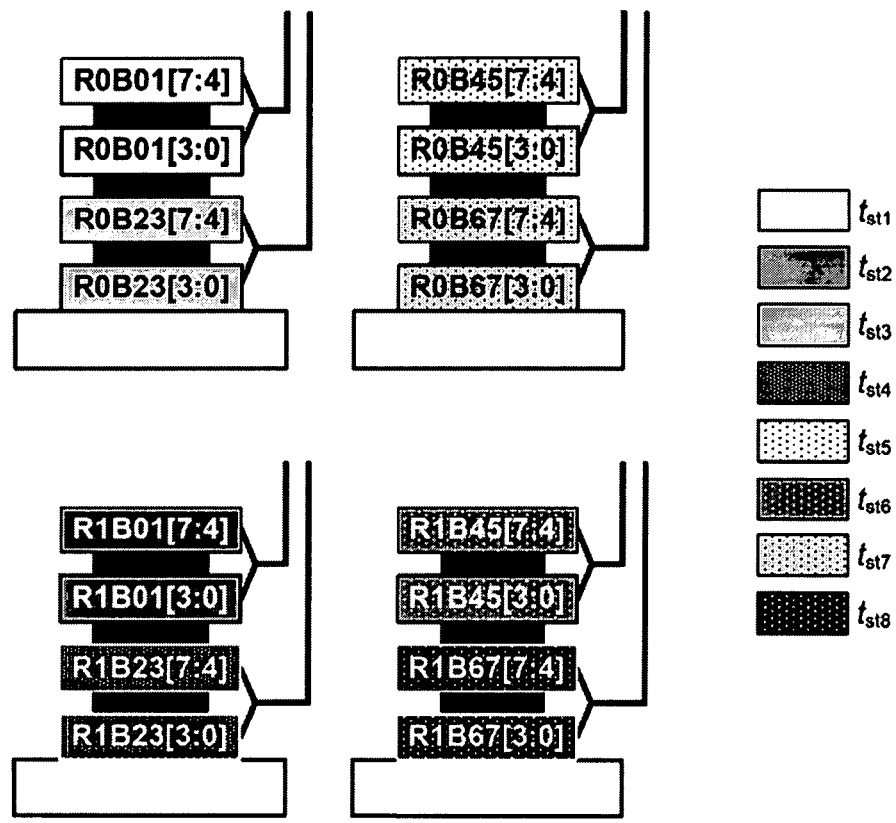
FIG. 8 illustrates a configuration of sixteen memory devices refreshed by eight independently controlled refresh cycles $t_{ST1}$, $t_{ST2}$, $t_{ST3}$ and $t_{ST4}$, $t_{ST5}$, $t_{ST6}$, $t_{ST7}$ and $t_{ST8}$, respectively, according to one embodiment.

FIG. 8 illustrates a configuration of sixteen memory devices refreshed by eight independently controlled refresh cycles, according to yet another embodiment. Such a configuration is referred to herein as an "octal configuration." The motivation for this stagger schedule is the same as for the previously mentioned dual and quad configurations, however in the octal configuration it is not possible to complete all refresh operation on all eight memories within the window unless the operations are bunched up more closely than in the quad or dual cases.

Figure 9:
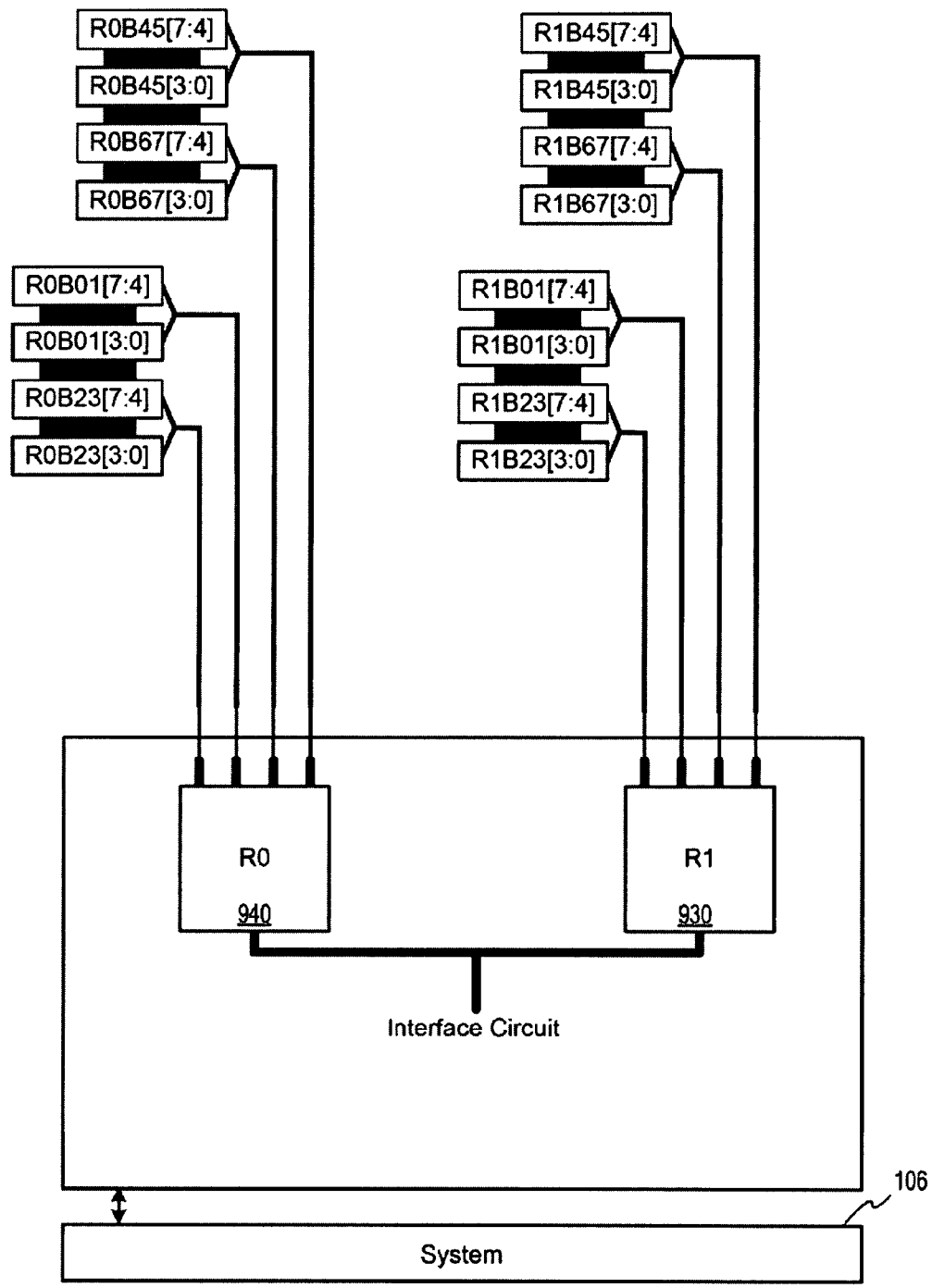
FIG. 9 illustrates the octal configuration of the memory devices of FIG. 8 implemented within the multiple memory device system of FIG. 1A, according to one embodiment.

FIG. 9 illustrates the octal configuration of the memory devices of FIG. 8 implemented within the multiple memory device system 100 of FIG. 1A, according to one embodiment. As previously described, the system device 106 is connected to the interface circuit 102, which, in turn, is connected to the memory devices 104A-N. As shown in FIG. 9, there are four independently controllable refresh command sequence outputs of block 930. Outputs of R0 are independently controllable refresh command sequences. Also, outputs of R1 are independently controllable refresh command sequences. The blocks 930, 940, implement their respective functionalities using a combination of logic gates, transistors, finite state machines, programmable logic or any technique capable of operating on or delaying logic or analog signals.

The techniques and exemplary embodiments for how to independently control refresh command sequences to a plurality of memory devices using an interface circuit have now been disclosed. The following describes various techniques for calculating the timing of assertions of the refresh command sequences.

Figure 10A:
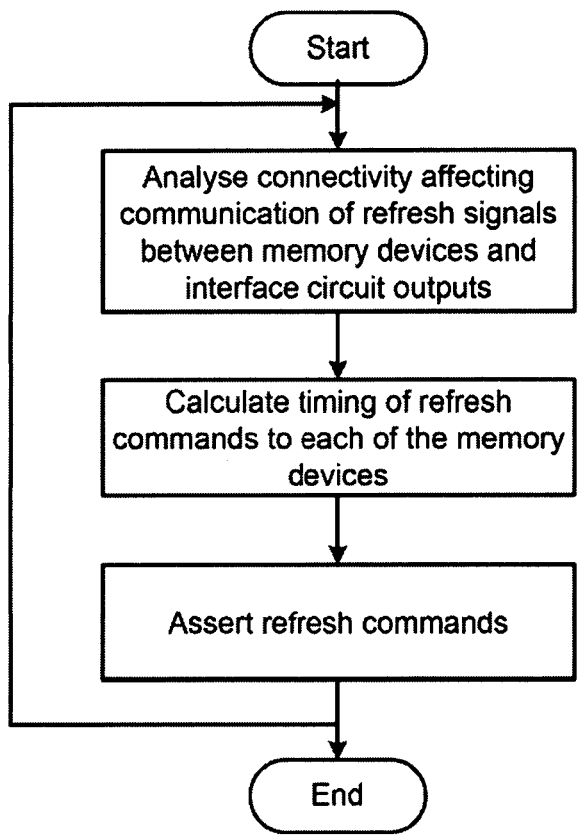
FIG. 10A is a flowchart of method steps for configuring, calculating, and generating the timing and assertion of two or more refresh commands, according to one embodiment.

FIG. 10A is a flowchart of method steps for configuring, calculating, and generating the timing and assertion of two or more refresh command sequences, according to one embodiment. Although the method is described with respect to the system of FIG. 1A, persons skilled in the art will understand that any system configured to perform the method steps, in any order, is within the scope of the claims. As shown in FIG. 10A, the method includes the steps of analyzing the connectivity of the refresh command sequences between the memory devices 104 A-N and the interface circuit 102 outputs, calculating the timing of each of the independently controlled refresh command sequences, and asserting each of the refresh command sequences at the calculated time. In exemplary embodiments, one or more of the steps of FIG. 10A are performed in the logic embedded in the interface circuit 102. In another embodiment one or more of the steps of FIG. 10A are performed in the logic embedded in the interface circuit 102 while any remaining steps of FIG. 10A are performed in the intelligent buffer 133.

In one embodiment, analyzing the connectivity of the refresh command sequences between the memory devices 104A-N and the interface circuit 102 outputs is performed statically, prior to applying power to the system device 106. Any number of characteristics of the system device 106, motherboard, trace-length, capacitive loading, memory type, interface circuit output buffers, or other physical design characteristics, may be used in an analysis or simulation in order to analyze or optimize the timing of the plurality of independently controllable refresh command sequences.

In another embodiment, analyzing the connectivity of the refresh command sequences between the memory devices 104A-N and the interface circuit 102 outputs is performed dynamically, after applying power to the system device 106. Any number of characteristics of the system device 106, motherboard, trace-length, capacitive loading, memory type, interface circuit output buffers, or other physical design characteristics, may be used in an analysis or simulation in order to analyze or optimize the timing of the plurality of independently controllable refresh command sequences.

In some embodiments of the multiple memory device system of FIG. 1A, the physical design can have a significant impact on the current draw, voltage droop, and staggering of the multiple independently controlled refresh command sequences. A designer of a DIMM, motherboard, or system would seek to minimize spikes in current draw, the resulting voltage droop on the VDD voltage supply, and still meet the required refresh cycle time. Some rules and guidelines for the physical design of the trace lengths and capacitance for the signals 108, and for the packaging of the memory circuits 104A-104N as related to refresh staggering include:

Reduce the inductance between intelligent buffer 133 and each memory device 132A-N, between intelligent buffer 133 and the intelligent register 102.

Increase decoupling capacitance between VDD and VSS at all levels of the PDS: PCB, BGA, substrate, wirebond, RDL and die.

Separate the spikes in current draw by staggering the refresh times between multiple memory devices.

In another embodiment, configuring the connectivity of the refresh command sequences between the memory devices 104A-N and the interface circuit 102 outputs is performed periodically at times after application of power to the system device 106. Dynamic configuration uses a measurement unit (e.g., element 1202 of FIG. 12) that is capable of performing a series of analog and logic tests on one or more of various pins of the interface circuit 102 such that actual characteristics of the pin is measured and stored for use in refresh scheduling calculations. Examples of such characteristics include, but are not limited to timing of response at first detected voltage change, timing of response where detected voltage change crosses the logic__1/logic__0 threshold value, timing of response at peak detected voltage change, duration and amplitude of response ring, operating frequency of the interface circuit and operating frequency of the DRAM devices etc.

Figure 10B:
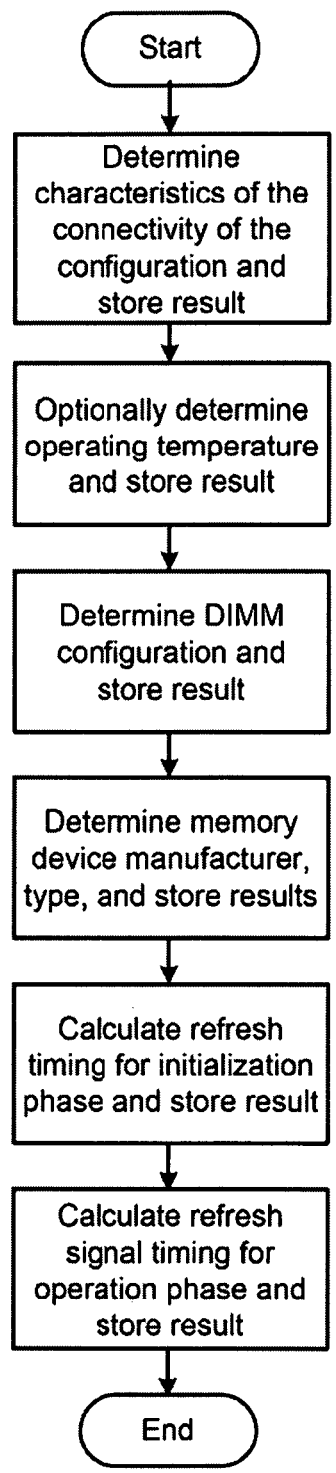
FIG. 10B depicts a series of operations for calculating refresh stagger times for a given configuration.

FIG. 10B shows steps of a method to be performed periodically at some time after application of power to the system device 106. The steps include determining the connectivity characteristics of the affecting communication of the refresh commands, determining operating conditions, including one or more temperatures, determining the configuration of the memory (e.g. size, number of ranks, memory word organization, etc.), calculating the refresh timing for initialization, and calculating refresh timing for the operation phase. Similarly to the method of 10A, the method of 10B may be applied repeatedly, beginning at any step, in an autonomous fashion or based on any technically feasible event, such as a power-on reset event or the receipt of a time-multiplexed or other signal, a logical combination of signals, a combination of signals and stored state, a command or a packet from any component of the host system, including the memory controller.

Figure 11:
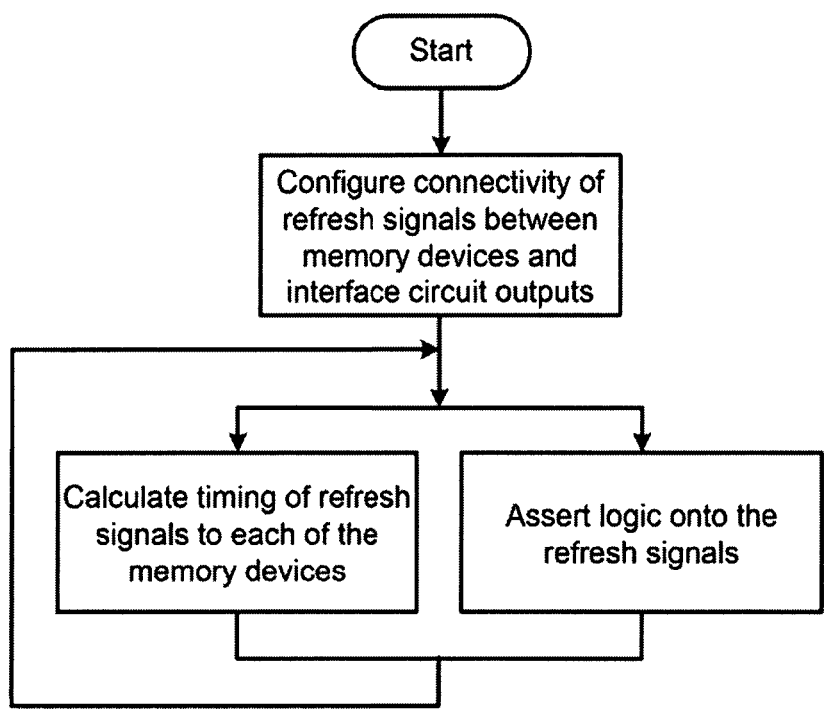
FIG. 11 is a flowchart of method steps for configuring, calculating, and generating the timing and assertion of two or more refresh commands continuously and asynchronously, according to one embodiment.

In embodiments where one or more temperatures are measured, the calculation of the refresh timing considers not only the measured temperatures, but also the manufacturer's specifications of the DRAMs FIG. 11 is a flowchart of method steps for analysing, calculating, and generating the timing and assertion of two or more refresh command sequences continuously and asynchronously, according to one embodiment. Although the method is described with respect to the systems of FIGS. 1A, 1B, 1C, and FIG. 12, persons skilled in the art will understand that any system configured to implement the method steps in any order, is within the scope of the claims. As shown in FIG. 11, the method includes the steps of continuously and asynchronously analysing the connectivity affecting the assertion of refresh commands between the memory devices 104A-N and the interface circuit 102 outputs, continuously and asynchronously calculating the timing of each of the independently controlled refresh command sequences, and continuously and asynchronously scheduling the assertion of each of the refresh command sequences at the calculated time. In one embodiment, the method steps of FIG. 11 may be implementation in hardware. Those skilled in the art will recognize that physical characteristics such as capacitance, resistance, inductance and temperature may vary slightly with time and during operation, and such variations may affect scheduling of the refresh commands. Moreover, during operation, the assertion of refresh commands is intended to continue on a schedule that is not in violation of any schedule required by the DRAM manufacturer, therefore the step of calculating timing of refresh command sequences and may operate concurrently with the step of asserting refresh command sequences.

Figure 12:
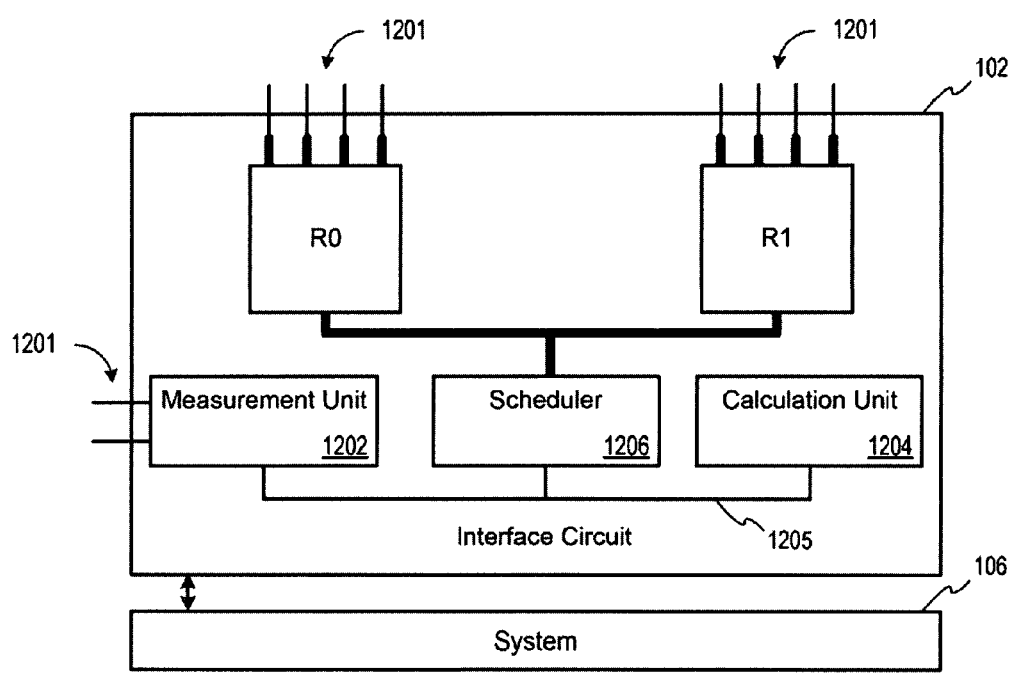
FIG. 12 illustrates the interface circuit of FIG. 1A with refresh command outputs adapted to connect to a plurality of memory devices, such as the memory devices of FIG. 1A, according to one embodiment.

FIG. 12 illustrates the interface circuit 102 of FIG. 1A with refresh command sequence outputs 1201 adapted to connect to a plurality of memory devices, such as the memory devices 104A-N of FIG. 1A, according to one embodiment. In this embodiment, each of a measurement unit 1202, a calculation unit 1204, and a scheduler 1206 is configured to operate continuously and asynchronously.

The measurement unit 1202 is configured to generate signals 1205 and to sample analog values of inputs 1203 either autonomously at some time after power-on or upon receiving a command from the system device 106. The measurement unit 1202 also is operable to determine the configuration of the memory devices 104A-N (not shown). The configuration determination and measurements are communicated to the calculation unit 1204. The calculation unit 1204 analyses the measurements received from the measurement unit 1202 and calculates the optimized timing for staggering the refresh command sequences, as previously described herein.

Understanding the use of the disclosed techniques for managing refresh commands, there are many apparent embodiments based upon industry-standard configurations of DRAM devices.

Figure 13:
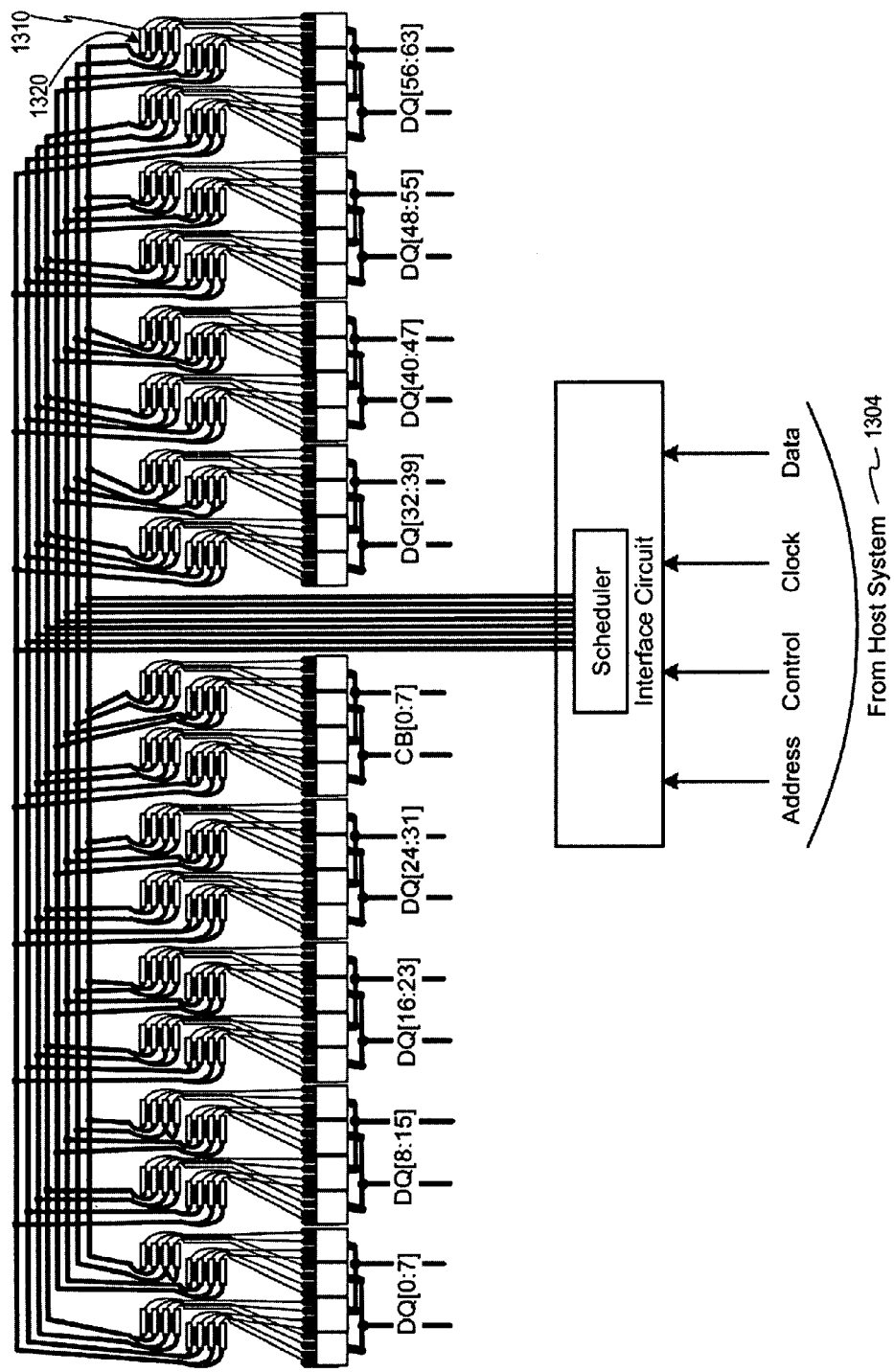
FIG. 13 is an exemplary illustration of a 72-bit ECC DIMM based upon industry-standard DRAM devices arranged vertically into stacks and horizontally into an array of stacks, according to one embodiment.

FIG. 13 is an exemplary illustration of a 72-bit ECC (error-correcting code) DIMM based upon industry-standard DRAM devices 1310 arranged vertically into stacks 1320 and horizontally into an array of stacks, according to one embodiment. As shown, the stacks of DRAM devices 1320 are organized into an array of stacks of sixteen 4-bit wide DRAM devices 1310 resulting in a 72-bit wide DIMM. Persons skilled in the art will understand that many configurations of the ECC DIMM of FIG. 13 may be possible and envisioned. A few of the exemplary configurations are further described in the following paragraphs.

In another embodiment, the configuration contains N DRAM devices, each of capacity M that—in concert with the interface circuit(s) 1470—emulates one DRAM devices, each of capacity N*M. In a system with a system device 1420 designed to interface with a DRAM device of capacity N*M, the system device will allow for a longer refresh cycle time than it would allow to each DRAM device of capacity M. In this configuration, when a refresh command is issued by the system device to the interface circuit, the interface circuit will stagger N numbers of refresh cycles to the N numbers of DRAM devices. In one optional feature, the interface circuit may use a user-programmable setting or a self calibrated frequency detection circuit to compute the optimal stagger spacing between each of the N numbers of refresh cycles to each of the N numbers of DRAM devices. The result of the computation is minimized voltage droop on the power delivery network and functional correctness in that the entire sequence of N staggered refresh events are completed within the refresh cycle time expected by the system device. For example, a configuration may contain 4 DRAM devices, each 1 gigabit in capacity that an interface circuit may use to emulate one DRAM device that is 4 gigabit in capacity. In a JEDEC compliant DDR2 memory system, the defined refresh cycle time for the 4 gigabit device is 327.5 nanoseconds, and the defined refresh cycle time for the 1 gigabit device is 127.5 nanoseconds. In this specific example, the interface circuit may stagger refresh commands to each of the 1 gigabit DRAM devices with spacing that is carefully selected based on the operating characteristics of the system, such as temperature, frequency, and voltage levels, while still ensuring that that the entire sequence is complete within the 327.5 ns expected by the memory controller.

In another embodiment, the configuration contains 2*N DRAM devices, each of capacity M that—in concert with the interface circuit(s) 1470—emulates two DRAM devices, each of capacity N*M. In a system with a system device 1420 designed to interface with a DRAM device of capacity N*M, the system device will allow for a longer refresh cycle time than it would allow to each DRAM device of capacity M. In this configuration, when a refresh command is issued by the system device to the interface circuit to refresh one of the two emulated DRAM devices, the interface circuit will stagger N numbers of refresh cycles to the N numbers of DRAM devices. In one optional feature when the system device issues the refresh command to the interface circuit to refresh both of the emulated DRAM devices, the interface circuit will stagger 2*N numbers of refresh cycles to the 2*N numbers of DRAM devices to minimize voltage droop on the power delivery network, while ensuring that the entire sequence completes within the allowed refresh cycle time of the single emulated DRAM device of capacity N*M.

As can be understood from the above discussion of the several disclosed configurations of the embodiments of FIG. 13, there exist at least as many refresh command sequence spacing possibilities as there are possible configurations of DRAM memory devices on a DIMM.

The response of a memory device to one or more time-domain pulses can be represented in the frequency domain as a spectrograph. Similarly, the power delivery system of a motherboard has a natural frequency domain response. In one embodiment, the frequency domain response of the power delivery system is measured, and the timing of refresh command sequence for a DIMM configuration is optimized to match the natural frequency response of the power delivery subsystem. That is, the frequency domain characteristics between the power delivery system and the memory device on the DIMM are anti-correlated such that the energy of the pulse stream of refresh command sequences spread the energy of the pulse stream out over a broad spectral range. Accordingly one embodiment of a method for optimizing memory refresh command sequences in a DIMM on a motherboard is to measure and plot the frequency domain response of the motherboard power delivery system, measure and plot the frequency domain response of the memory devices, superimpose the two frequency domain plots and define a refresh command sequence pulse train which frequency domain response, when superimposed on the aforementioned plots results in a flatter frequency domain response.

Figure 14:
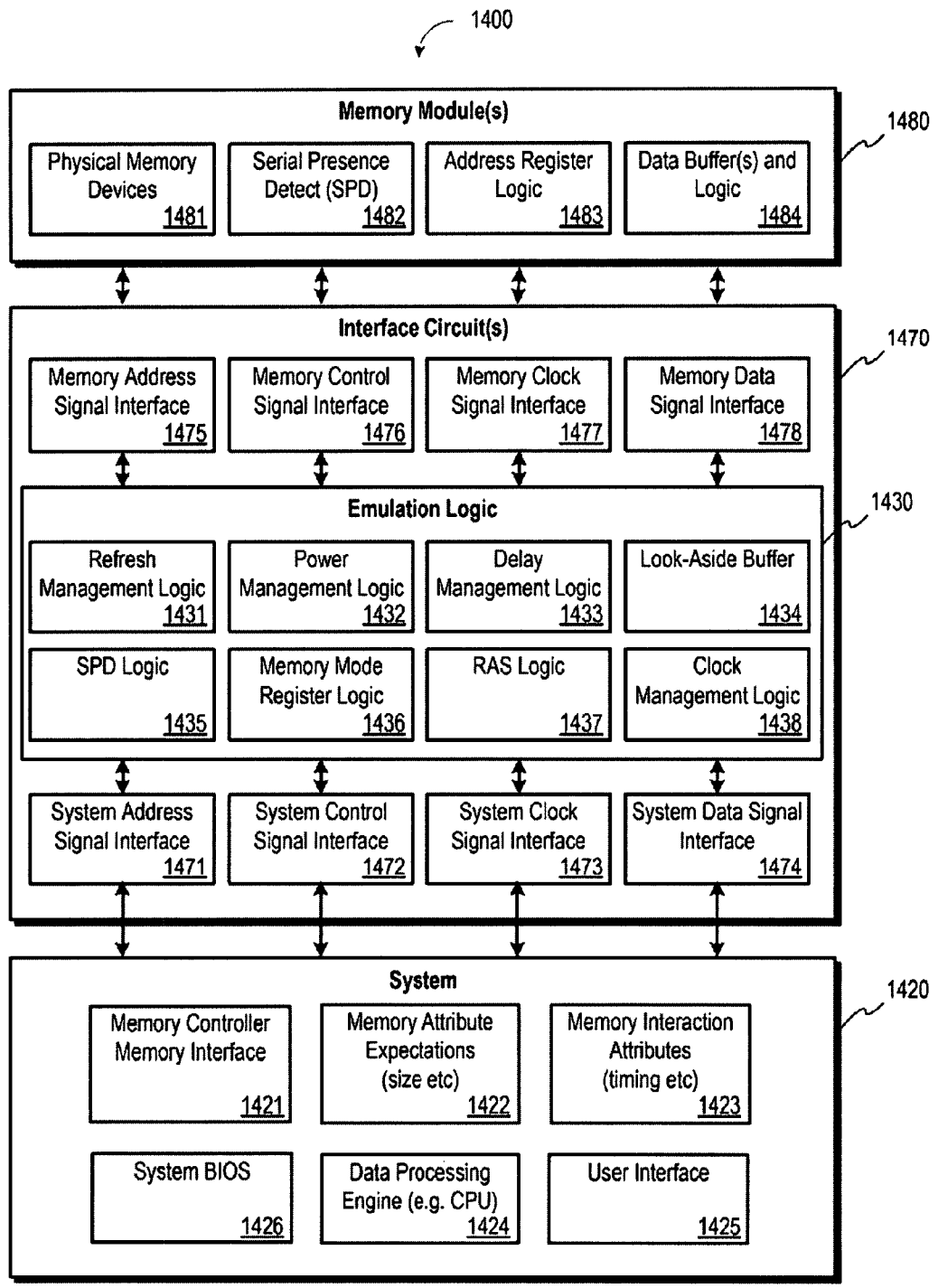
FIG. 14 is a conceptual illustration of a computer platform including an interface circuit.

FIG. 14 is a conceptual illustration of a computer platform 1400 configured to implement one or more aspects of the embodiments. As an option, the contents of FIG. 14 may be implemented in the context of the architecture and/or environment of the figures previously described herein. Of course, however, such contents may be implemented in any desired environment.

As shown, the computer platform 1400 includes, without limitation, a system device 1420 (e.g., a motherboard), interface circuit(s) 1470, and memory module(s) 1480 that include physical memory devices 1481 (e.g., physical memory devices, such as the memory devices 104A-N shown in FIG. 1A). In one embodiment, the memory module(s) 1480 may include DIMMs. The physical memory devices 1481 are connected directly to the system 1420 by way of one or more sockets.

In one embodiment, the system device 1420 includes a memory controller 1421 designed to the specifics of various standards, in particular the standard defining the interfaces to JEDEC-compliant semiconductor memory (e.g., DRAM, SDRAM, DDR2, DDR3, etc.). The specifications of these standards address physical interconnection and logical capabilities. FIG. 14 depicts the system device 1420 further including logic for retrieval and storage of external memory attribute expectations 1422, memory interaction attributes 1423, a data processing engine 1424, various mechanisms to facilitate a user interface 1425, and the system basic Input/Output System (BIOS) 1426.

In various embodiments, the system device 1420 may include a system BIOS program capable of interrogating the physical memory module 1480 (e.g., DIMMs) as a mechanism to retrieve and store memory attributes. Furthermore, in external memory embodiments, JEDEC-compliant DIMMs include an EEPROM device known as a Serial Presence Detect (SPD) 1482 where the DIMM's memory attributes are stored. It is through the interaction of the system BIOS 1426 with the SPD 1482 and the interaction of the system BIOS 1426 with the physical attributes of the physical memory devices 1481 that the various memory attribute expectations and memory interaction attributes become known to the system device 1420. Also optionally included on the memory module(s) 1480 are an address register logic 1483 (e.g. JEDEC standard register, register, etc.) and data buffer(s) and logic 1484.

In various embodiments, the compute platform 1400 includes one or more interface circuits 1470, electrically disposed between the system device 1420 and the physical memory devices 1481. The interface circuits 1470 may be physically separate from the DIMM, may be placed on the memory module(s) 1480, or may be part of the system device 1420 (e.g., integrated into the memory controller 1421, etc.)

Some characteristics of the interface circuit(s) 1470, in accordance with an optional embodiment, includes several system-facing interfaces such as, for example, a system address signal interface 1471, a system control signal interface 1472, a system clock signal interface 1473, and a system data signal interface 1474. Similarly, the interface circuit(s) 1470 may include several memory-facing interfaces such as, for example, a memory address signal interface 1475, a memory control signal interface 1476, a memory clock signal interface 1477, and a memory data signal interface 1478.

In additional embodiments, an additional characteristic of the interface circuit(s) 1470 is the optional presence of one or more sub-functions of emulation logic 1430. The emulation logic 1430 is configured to receive and optionally store electrical signals (e.g., logic levels, commands, signals, protocol sequences, communications) from or through the system-facing interfaces 1471-1474 and to process those signals. In particular, the emulation logic 1430 may contain one or more sub functions (e.g., power management logic 1432 and delay management logic 1433) configured to manage refresh command sequencing with the physical memory devices 1481.

Aspects of embodiments of the invention can be implemented in hardware or software or both, with the software being delivered as a program product for use with a computer system. The program(s) of the program product defines functions of the embodiments (including the methods described herein) and can be contained on a variety of computer-readable storage media. Illustrative computer-readable storage media include, but are not limited to: (i) non-writable storage media (e.g., read-only memory devices within a computer such as CD-ROM disks readable by a CD-ROM drive) on which information is permanently stored; and (ii) writable storage media (e.g., floppy disks within a diskette drive or hard-disk drive) on which alterable information is stored. Such computer-readable storage media, when carrying computer-readable instructions that direct the functions disclosed herein, are yet further embodiments.

While the foregoing is directed to exemplary embodiments, other and further embodiments may be devised without departing from the basic scope thereof.

We claim:

1. A memory module comprising:

2*N dynamic random access memory (DRAM) devices each having a capacity of M, wherein the 2*N DRAM devices comprising:

a first group of N DRAM devices; and a second group of N DRAM devices, wherein each of the N DRAM devices in the first group shares a distinct refresh control signal with a respective DRAM device in the second group;

emulation logic configured to emulate an interface protocol of two emulated DRAM devices each having a capacity of N*M, wherein a first of the two emulated DRAM devices includes the N DRAM devices from the first group, and a second of the two emulated DRAM devices includes the N DRAM devices from the second group;

an interface circuit configured to receive from a memory controller a refresh command for the two emulated DRAM devices, the interface circuit including:

a calculation unit configured to determine offset timings for N independently controlled staggered refresh cycles, wherein exactly one DRAM device from the first group and one DRAM device from the second group are refreshed in each of the independently controlled staggered refresh cycles, the offset timings providing timings of each of the independently controlled staggered refresh cycles; and a scheduler configured to order independently controlled staggered refresh commands directed to the 2*N DRAM devices in the first and the second groups based on the offset timings determined by the calculation unit.

2. The memory module of claim 1, wherein the interface circuit further comprises:
   a measurement unit configured to perform analog signal measurements and to determine a configuration of DRAM devices;
   wherein the calculation unit is configured to determine the independently controlled staggered refresh cycles based on measurements received from the measurement unit and the refresh command received from the memory controller.

3. The memory module of claim 2, wherein the measurement unit is further configured to perform a series of analog measurements to determine analog pin characteristics of DRAM devices.

4. The memory module of claim 2, wherein the measurement unit is further configured to perform a series of analog measurements to determine timing responses at selected logic threshold levels.

5. The memory module of claim 2, wherein the measurement unit is further configured to perform a series of analog measurements to determine a timing response at a peak detected voltage change, a duration and a response ring.

6. The memory module of claim 2, wherein the measurement unit is further configured to perform a series of measurements to determine an operating temperature of each of the DRAM devices.

7. The memory module of claim 1, wherein the calculation unit is configured to determine the offset timings for two independently controlled staggered refresh cycles for four DRAM devices coupled to the interface circuit, wherein the two independently controlled staggered refresh cycles are staggered by an amount of time equal to approximately half a single refresh cycle associated with the refresh command received from the memory controller, and wherein each of the two independently controlled staggered refresh cycles refreshes a DRAM device in the first group and a DRAM device in the second group.

8. The memory module of claim 1, wherein the calculation unit is configured to determine the offset timings for four independently controlled staggered refresh cycles for eight DRAM devices coupled to the interface circuit, wherein the four independently controlled staggered refresh cycles are staggered by an amount of time equal to approximately a quarter of a single refresh cycle associated with the refresh command received from the memory controller, and wherein each of the four independently controlled staggered refresh cycles refreshes a DRAM device in the first group and a DRAM device in the second group.

9. The memory module of claim 1, wherein the calculation unit is configured to determine the offset timings for eight independently controlled staggered refresh cycles for sixteen DRAM devices coupled to the interface circuit, wherein the eight independently controlled staggered refresh cycles are staggered by an amount of time equal to approximately an eighth of a single refresh cycle associated with the refresh command received from the memory controller and wherein each of the eight independently controlled staggered refresh cycles refreshes a DRAM device in the first group and a DRAM device in the second.

10. The memory module of claim 1, wherein the calculation unit is configured to dynamically determine, at a time subsequent to applying power to the dynamic random access memory devices, the offset timings for the independently controlled staggered refresh cycles that minimize instantaneous power supply load.

11. The memory module of claim 1, wherein the interface circuit further comprises a memory address signal interface, a memory control signal interface, a memory clock signal interface, and a memory data signal interface.

12. The memory module of claim 1, wherein each of the independently controlled staggered refresh cycles is transmitted to exactly two DRAM devices in a group.

13. The memory module of claim 12, wherein the interface circuit is integrated within one of the first group or second group.

14. The memory module of claim 13, wherein the interface circuit comprises an intelligent buffer chip.

15. The memory module of claim 14, wherein the memory module is a dual in-line memory module.

16. The memory module of claim 1, wherein the independently controlled staggered refresh cycles or the scheduling are performed asynchronously.

17. The memory module of claim 16, wherein the memory module is a dual in-line memory module.

18. The memory module of claim 1, wherein a time difference between the timings of each of the N independently controlled staggered refresh cycles differs for each of the independently controlled staggered refresh cycles.

19. A memory module comprising:
   2*N dynamic random access memory (DRAM) devices each having a capacity of M, wherein the 2*N DRAM devices comprise:
      a first group of N DRAM devices; and
      a second group of N DRAM devices, wherein each of the N DRAM devices in the first group shares a distinct refresh control signal with a respective DRAM device in the second group; and
   an interface circuit comprising:
      emulation logic configured to emulate an interface protocol of two emulated DRAM devices each having a capacity of N*M, wherein a first of the two emulated DRAM devices includes the N DRAM devices from the first group, and a second of the two emulated DRAM devices includes the N DRAM devices from the second group;
      a calculation unit configured to determine offset timings for N independently controlled staggered refresh cycles, wherein exactly one DRAM device from the first group and one DRAM device from the second group are refreshed in each of the independently controlled staggered refresh cycles, the offset timings providing timings of each of the independently controlled staggered refresh cycles; and
      a scheduler configured to order independently controlled staggered refresh commands directed to the 2*N DRAM devices based on the offset timings determined by the calculation unit.

20. The memory module of claim 19, wherein the interface circuit further comprises:
   a measurement unit configured to perform analog signal measurements and to determine a configuration of DRAM devices;
   wherein the calculation unit is configured to determine the independently controlled staggered refresh cycles based on measurements received from the measurement unit and the refresh command received from the memory controller.

21. The memory module of claim 19, wherein the calculation unit is configured to dynamically determine, at a time subsequent to applying power to the dynamic random access memory devices, the offset timings for the independently controlled staggered refresh cycles that minimize instantaneous power supply load.

22. A sub-system comprising:
a printed circuit board;
a memory module comprising:
 2*N dynamic random access memory (DRAM) devices each having a capacity of M, wherein the 2*N DRAM devices comprise:
  a first group of N DRAM devices; and
  a second group of N DRAM devices, wherein each of the N DRAM devices in the first group shares a distinct refresh control signal with a respective DRAM device in the second group; and
an interface circuit comprising:
 emulation logic configured to emulate an interface protocol of two emulated DRAM devices each having a capacity of N*M, wherein a first of the two emulated DRAM devices includes the N DRAM devices from the first group, and a second of the two emulated DRAM devices includes the N DRAM devices from the second group;
 a calculation unit configured to determine offset timings for N independently controlled staggered refresh cycles, wherein exactly one DRAM device from the first group and one DRAM device from the second group are refreshed in each of the independently controlled staggered refresh cycles, the offset timings providing timings of each of the independently controlled staggered refresh cycles; and
 a scheduler configured to order independently controlled staggered refresh commands directed to the 2*N DRAM devices based on the offset timings determined by the calculation unit,
wherein the memory module and the interface circuit are mounted to the printed circuit board, and the memory module is electrically coupled to the interface circuit.

23. The sub-system of claim 22, wherein the interface circuit further comprises:
a measurement unit configured to perform analog signal measurements and to determine a configuration of DRAM devices;
wherein the calculation unit is configured to determine the independently controlled staggered refresh cycles based on measurements received from the measurement unit and the refresh command received from the memory controller.

24. The sub-system of claim 22, wherein the calculation unit is configured to dynamically determine, at a time subsequent to applying power to the dynamic random access memory devices, the offset timings for the independently controlled staggered refresh cycles that minimize instantaneous power supply load.

* * * * *

UNITED STATES PATENT AND TRADEMARK OFFICE
CERTIFICATE OF CORRECTION

PATENT NO.        : 8,566,516 B2                                      Page 1 of 1
APPLICATION NO.   : 11/929631
DATED             : October 22, 2013
INVENTOR(S)       : Keith R. Schakel et al.

It is certified that error appears in the above-identified patent and that said Letters Patent is hereby corrected as shown below:

In the Specification:

Column 1, line 18, after "matter" please insert -- of --; and

In the Claims:

Column 15, line 64, Claim 9, please delete "second." and insert therefor -- second group. --.

Signed and Sealed this
Twenty-fifth Day of February, 2014

Michelle K. Lee
*Deputy Director of the United States Patent and Trademark Office*